(12) United States Patent
Wang et al.

(10) Patent No.: US 12,432,980 B2
(45) Date of Patent: Sep. 30, 2025

(54) OXIDE THIN FILM TRANSISTOR AND PREPARATION METHOD THEREOF, AND DISPLAY DEVICE

(71) Applicant: BOE TECHNOLOGY GROUP CO., LTD., Beijing (CN)

(72) Inventors: Lizhong Wang, Beijing (CN); Guangcai Yuan, Beijing (CN); Ce Ning, Beijing (CN); Nianqi Yao, Beijing (CN); Hehe Hu, Beijing (CN); Liping Lei, Beijing (CN); Dongfang Wang, Beijing (CN); Dapeng Xue, Beijing (CN); Shuilang Dong, Beijing (CN); Zhengliang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/781,773

(22) PCT Filed: Jun. 25, 2021

(86) PCT No.: PCT/CN2021/102511
§ 371 (c)(1),
(2) Date: Jun. 2, 2022

(87) PCT Pub. No.: WO2022/267043
PCT Pub. Date: Dec. 29, 2022

(65) Prior Publication Data
US 2024/0097042 A1    Mar. 21, 2024

(51) Int. Cl.
*H10D 30/67* (2025.01)
(52) U.S. Cl.
CPC ..... *H10D 30/6755* (2025.01); *H10D 30/6739* (2025.01); *H10D 30/6757* (2025.01)

(58) Field of Classification Search
CPC ............ H10D 30/6739; H10D 30/6755–6757
See application file for complete search history.

(56) References Cited

U.S. PATENT DOCUMENTS

| | | |
|---|---|---|
| 9,076,718 B2 | 7/2015 | Ohta et al. |
| 9,640,555 B2 | 5/2017 | Okazaki et al. |
| (Continued) | | |

FOREIGN PATENT DOCUMENTS

| | | |
|---|---|---|
| CN | 102473727 A | 5/2012 |
| CN | 102664194 A | 9/2012 |
| (Continued) | | |

OTHER PUBLICATIONS

International Search Report in PCT/CN2021/102511 idated Mar. 16, 2022 in English.
(Continued)

*Primary Examiner* — Daniel P Shook
(74) *Attorney, Agent, or Firm* — Collard & Roe, P.C.

(57) ABSTRACT

At least one embodiment of the present disclosure provides an oxide thin film transistor, a display device, and a preparation method of the oxide thin film transistor, and the oxide thin film transistor includes a base substrate; an oxide semiconductor layer provided on the base substrate, and an insulating layer provided on a side of the oxide semiconductor layer away from the base substrate; in which the insulating layer is made of oxide; the insulating layer includes a first insulating layer and a second insulating layer which are stacked; a density of the second insulating layer is greater than a density of the first insulating layer; and the second insulating layer is farther away from the base substrate than the first insulating layer.

14 Claims, 11 Drawing Sheets

(56) References Cited

U.S. PATENT DOCUMENTS

| | | | |
|---|---|---|---|
| 9,768,315 | B2 | 9/2017 | Koezuka et al. |
| 9,831,275 | B2 | 11/2017 | Koezuka et al. |
| 9,887,292 | B2 | 2/2018 | Liu et al. |
| 10,056,492 | B2 | 8/2018 | Yamazaki et al. |
| 10,164,075 | B2 | 12/2018 | Koezuka et al. |
| 10,748,938 | B2 | 8/2020 | Zhou et al. |
| 11,037,958 | B2 | 6/2021 | Luo |
| 11,189,732 | B2 | 11/2021 | Yuan |
| 2002/0113236 | A1 | 8/2002 | Park et al. |
| 2004/0238820 | A1 | 12/2004 | Sakama et al. |
| 2011/0248270 | A1 | 10/2011 | Fukumoto et al. |
| 2014/0339537 | A1 | 11/2014 | Bae |
| 2016/0163874 | A1 | 6/2016 | Nakano et al. |
| 2016/0276492 | A1 | 9/2016 | Takeda et al. |
| 2017/0033227 | A1 | 2/2017 | Yu et al. |
| 2017/0170330 | A1 | 6/2017 | Li |
| 2017/0170332 | A1 | 6/2017 | Yamazaki |
| 2020/0013807 | A1 | 1/2020 | Lee et al. |
| 2020/0027900 | A1 | 1/2020 | Ebihara et al. |
| 2020/0395426 | A1 | 12/2020 | Han et al. |
| 2022/0013667 | A1* | 1/2022 | Nakada ............... H10D 86/423 |
| 2022/0077264 | A1 | 3/2022 | Xue et al. |

FOREIGN PATENT DOCUMENTS

| | | | | |
|---|---|---|---|---|
| CN | 103000694 | A | * | 3/2013 |
| CN | 104752441 | A | | 7/2015 |
| CN | 105140271 | A | | 12/2015 |
| CN | 106256017 | A | | 12/2016 |
| CN | 106876412 | A | | 6/2017 |
| CN | 107507841 | A | | 12/2017 |
| CN | 107579077 | A | | 1/2018 |
| CN | 110190066 | A | | 8/2019 |
| CN | 110649044 | A | | 1/2020 |
| CN | 111312826 | A | | 6/2020 |
| CN | 111900195 | A | | 11/2020 |
| CN | 112038289 | A | | 12/2020 |
| CN | 112038410 | A | | 12/2020 |
| CN | 112103246 | A | | 12/2020 |
| CN | 112233982 | A | | 1/2021 |
| CN | 112436021 | A | | 3/2021 |
| CN | 112635573 | A | | 4/2021 |
| JP | 63228626 | A | | 9/1988 |
| JP | 2004172344 | A | | 6/2004 |
| JP | 2016086170 | A | | 5/2016 |
| JP | 202016697 | A | | 1/2020 |
| JP | 2020167362 | A | | 10/2020 |
| KR | 10-2012-0088145 | A | | 8/2012 |
| WO | WO2009/034953 | A1 | * | 3/2009 |
| WO | 2015059850 | A1 | | 4/2015 |
| WO | 2020/089726 | A1 | | 5/2020 |

OTHER PUBLICATIONS

Written Opinion of the International Searching Authority n PCT/CN2021/102511 dated Mar. 16, 2022 in English.

Extended European Search Report in European Application No. 21946535.8 dated Dec. 13, 2023.

Chen et al., Optimization of via etching process of LTPS TFT interlayer dielectric, Chinese Journal of Liquid Crystals and Displays, pp. 363-369, vol. 31, No. 4.

Zhao et al., Half-Corbino short-channel amorphous In—Ga—Zn—O thin-film transistors with a—SiOx or a—SiOx_a—SiNx passivation layers, Solid-State Electronics, 2016, pp. 25-31.

International Search Report in PCT/CN2021/102511 in Chinese dated Mar. 16, 2022.

Written Opinion in PCT/CN2021/102511 in Chinese dated Mar. 16, 2022.

Japanese Office Action in Japanese Application No. 2023-579589 dated May 7, 2025 with English translation.

* cited by examiner

OXIDE THIN FILM TRANSISTOR AND PREPARATION METHOD THEREOF, AND DISPLAY DEVICE

CROSS REFERENCE TO RELATED APPLICATIONS

This application is the National Stage of PCT/CN2021/102511 filed on Jun. 25, 2021, the disclosure of which is incorporated by reference.

TECHNICAL FIELD

Embodiments of the present disclosure relate to an oxide thin film transistor, a display device, and a preparation method of an oxide thin film transistor.

BACKGROUND

Oxide semiconductor thin film transistors have advantages such as high mobility, good stability, and simple fabrication process; oxide semiconductor material represented by Indium Gallium Zinc Oxide (IGZO) is widely applied to a display field such as a thin film transistor liquid crystal display (TFT-LCD) and an active matrix organic light emitting diode (AMOLED) panel or a non-display field (such as chip storage).

Thin film transistors may be divided into a top gate structure and a bottom gate structure according to a position of a gate electrode relative to an active region, and may be divided into a top contact structure and a bottom contact structure according to a position of a source-drain electrode relative to the active region; that is, thin film transistors usually have four types of structures, that is, bottom gate top contact (bottom gate staggered), bottom gate bottom contact (bottom gate coplanar), top gate top contact (top gate coplanar) and top gate bottom contact (top gate staggered) structures. At present, among the structures of the oxide semiconductor layer thin film transistors, the bottom gate structure mainly includes three types: an etching barrier type, a back channel etching type and a coplanar type; a process of fabricating a metal oxide thin film transistor of the back channel etching type is relatively simple, compared with the etching barrier type, one-time lithography process is omitted, which can reduce equipment investment and improve production efficiency.

SUMMARY

At least one embodiment of the present disclosure provides an oxide thin film transistor, and the oxide thin film transistor includes a base substrate; an oxide semiconductor layer provided on the base substrate, and an insulating layer provided on a side of the oxide semiconductor layer away from the base substrate; the insulating layer is made of oxide; the insulating layer includes a first insulating layer and a second insulating layer which are stacked; a density of the second insulating layer is greater than a density of the first insulating layer; and the second insulating layer is farther away from the base substrate than the first insulating layer.

For example, in the oxide thin film transistor provided by at least one embodiment of the present disclosure, the oxide semiconductor layer is a metal oxide semiconductor layer, and the insulating layer is made of non-metallic oxide.

For example, in the oxide thin film transistor provided by at least one embodiment of the present disclosure, materials of the first insulating layer and the second insulating layer at least include O atom and Si atom.

For example, in the oxide thin film transistor provided by at least one embodiment of the present disclosure, the insulating layer further includes a third insulating layer; the third insulating layer is provided on a side of the first insulating layer close to the base substrate; a density of the third insulating layer is greater than the density of the first insulating layer; and the third insulating layer is in contact with the oxide semiconductor layer.

For example, in the oxide thin film transistor provided by at least one embodiment of the present disclosure, the oxide semiconductor layer includes a first oxide semiconductor layer and a second oxide semiconductor layer which are stacked; a density of the second oxide semiconductor layer is greater than a density of the first oxide semiconductor layer; and the second oxide semiconductor layer is farther away from the base substrate than the first oxide semiconductor layer.

For example, in the oxide thin film transistor provided by at least one embodiment of the present disclosure, a source electrode and a drain electrode spaced apart from each other are provided between the oxide semiconductor layer and the insulating layer; and the oxide semiconductor layer and the insulating layer are in contact with each other in a region between the source electrode and the drain electrode.

For example, in the oxide thin film transistor provided by at least one embodiment of the present disclosure, a gate electrode is provided between the base substrate and the oxide semiconductor layer; a gate insulating layer is provided between the gate electrode and the oxide semiconductor layer, and a material of a portion of the gate insulating layer that is in contact with the oxide semiconductor layer is an oxide insulating material.

For example, in the oxide thin film transistor provided by at least one embodiment of the present disclosure, the gate insulating layer includes a first gate insulating layer, a second gate insulating layer, a third gate insulating layer and a fourth gate insulating layer which are stacked; the first gate insulating layer, the second gate insulating layer and the third gate insulating layer are all made of nitride; a thickness of the first gate insulating layer and a thickness of the third gate insulating layer are both less than a thickness of the second gate insulating layer; a density of the first gate insulating layer and a density of the third gate insulating layer are both less than a density of the second gate insulating layer; the fourth gate insulating layer is made of an oxide insulating material; and the fourth gate insulating layer is in contact with the oxide semiconductor layer.

For example, in the oxide thin film transistor provided by at least one embodiment of the present disclosure, a gate electrode is provided between a layer where the source electrode and the drain electrode are located and the oxide semiconductor layer; the insulating layer further includes a fourth insulating layer provided between the first insulating layer and the second insulating layer; and the gate electrode is provided between the fourth insulating layer and the first insulating layer.

For example, in the oxide thin film transistor provided by at least one embodiment of the present disclosure, the insulating layer further includes a fifth insulating layer provided between the first insulating layer and the fourth insulating layer; a density of the fifth insulating layer is greater than a density of the first insulating layer; and both a material of the fifth insulating layer and a material of the first insulating layer include Si and O.

For example, in the oxide thin film transistor provided by at least one embodiment of the present disclosure, a gate electrode is provided between a layer where the source electrode and the drain electrode are located and the oxide semiconductor layer; the insulating layer further includes a sixth insulating layer provided on a side of the second insulating layer that is away from the base substrate; and the gate electrode is provided between the sixth insulating layer and the first insulating layer.

For example, in the oxide thin film transistor provided by at least one embodiment of the present disclosure, a difference between an etching rate of the first insulating layer and an etching rate of the second insulating layer is 20 Å/s to 40 Å/s.

For example, in the oxide thin film transistor provided by at least one embodiment of the present disclosure, the etching rate for etching the first insulating layer is 55 Å/s to 90 Als; and the etching rate for etching the second insulating layer is 35 Å/s to 50 Å/s.

For example, in the oxide thin film transistor provided by at least one embodiment of the present disclosure, a difference between an etching rate of the first insulating layer and an etching rate of the second insulating layer is 20 Å/s to 40 Å/s; and a difference between the etching rate of the first insulating layer and an etching rate of the third insulating layer is 10 Å/s to 20 Å/s.

For example, in the oxide thin film transistor provided by at least one embodiment of the present disclosure, the etching rate for etching the first insulating layer is 55 Å/s to 90 Å/s; the etching rate for etching the second insulating layer is 35 Å/s to 50 Å/s, and the etching rate for etching the third insulating layer is 45 Å/s to 70 Å/s.

For example, in the oxide thin film transistor provided by at least one embodiment of the present disclosure, an etching solution used for etching the first insulating layer, the second insulating layer and the third insulating layer is a mixed solution of $NH_3F$ and HF; in the mixed solution of $NH_3F$ and HF, mass percentages of $NH_3F$ and HF are respectively 29.8% to 30.2% and 5.9% to 6.1%.

For example, in the oxide thin film transistor provided by at least one embodiment of the present disclosure, a thickness of the first insulating layer is 1,000 Å to 4,000 Å, a thickness of the second insulating layer is 100 Å to 2,000 Å, and a thickness of the third insulating layer is 700 Å to 1,000 Å.

For example, in the oxide thin film transistor provided by at least one embodiment of the present disclosure, under a temperature condition of 200° C. to 350° C., an oxygen release amount of the second insulating layer, the first insulating layer and the third insulating layer which are stacked is less than a sum of oxygen release amounts of the second insulating layer, the first insulating layer and the third insulating layer as single layers within a same temperature range.

For example, in the oxide thin film transistor provided by at least one embodiment of the present disclosure, an oxygen element release amount of the first insulating layer in a case that the temperature is higher than 300° C. is higher than an oxygen element release amount of the second insulating layer in a case that the temperature is higher than 300° C.

For example, in the oxide thin film transistor provided by at least one embodiment of the present disclosure, an oxygen element release amount of the first insulating layer in a case that the temperature is higher than 300° C. is higher than an oxygen element release amount of the second insulating layer or the third insulating layer in a case that the temperature is higher than 300° C.

At least one embodiment of the present disclosure further provides a display device, and the display device includes any one of the oxide thin film transistors mentioned above.

At least one embodiment of the present disclosure further provides a preparation method of an oxide thin film transistor, and the preparation method includes: providing a base substrate; forming an oxide semiconductor layer on the base substrate; forming a first insulating layer on a side of the oxide semiconductor layer away from the base substrate; and forming a second insulating layer on a side of the first insulating layer away from the base substrate; in which a density of the second insulating layer is greater than a density of the first insulating layer; and the second insulating layer is farther away from the base substrate than the first insulating layer.

The preparation method provided by at least one embodiment of the present disclosure, further includes: forming a third insulating layer on a side of the first insulating layer close to the base substrate, in which a density of the third insulating layer is greater than a density of the first insulating layer.

For example, in the preparation method provided by at least one embodiment of the present disclosure, the forming an oxide semiconductor layer includes: applying a first oxide semiconductor layer thin film and performing a patterning process to form the first oxide semiconductor layer; applying a second oxide semiconductor layer thin film on the first oxide semiconductor layer and performing a patterning process to form a second oxide semiconductor layer; in which a density of the second oxide semiconductor layer is greater than a density of the first oxide semiconductor layer.

For example, the preparation method provided by at least one embodiment of the present disclosure, further includes: applying a metal electrode thin film on a side of the oxide semiconductor layer away from the base substrate, and performing a patterning process on the metal electrode thin film to form a source electrode and a drain electrode spaced apart from each other, in which the oxide semiconductor layer is in contact with the insulating layer in a region between the source electrode and the drain electrode.

For example, the preparation method provided by at least one embodiment of the present disclosure, before forming the oxide semiconductor layer, further includes: applying a gate electrode thin film on the base substrate, performing a patterning process on the gate electrode thin film to form a gate electrode; and applying a gate insulating layer thin film on the gate electrode to form a gate insulating layer; in which a material of a portion of the gate insulating layer that is in contact with the oxide semiconductor layer is an oxide insulating material.

For example, the preparation method provided by at least one embodiment of the present disclosure, further includes: applying a gate electrode thin film between a layer where the source electrode and the drain electrode are located and the oxide semiconductor layer, performing a patterning process on the gate electrode thin film to form a gate electrode; and forming a fourth insulating layer on the gate electrode.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1:
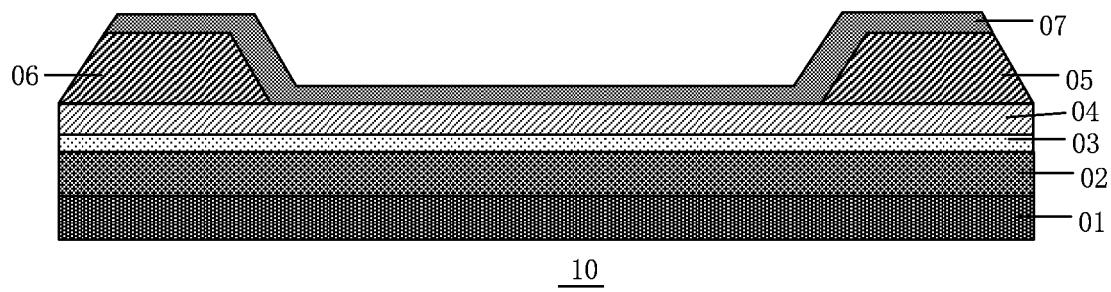
FIG. 1 is a structural schematic diagram of a cross section of an oxide thin film transistor.

In order to make objects, technical details and advantages of embodiments of the present disclosure clear, the technical solutions of the embodiments will be described in a clearly and completely way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

As compared with silicon-based semiconductor thin film transistors and organic semiconductor thin film transistors, oxide semiconductor thin film transistors are increasingly important in high-end display fields due to higher mobility thereof. With gradual development of electronic products, development of oxide thin film transistors with high mobility has become a focus of research and development for respective display panel manufacturers. However, with improvement of mobility of the oxide semiconductor thin film transistors, requirements for stability of the oxide semiconductor thin film transistors are also higher and higher. In order to improve stability of materials having high mobility in oxide semiconductor thin film transistors, application of high temperature processes is becoming more and more extensive, which puts forward higher oxygen replenishment capability for an insulating layer in contact with or adjacent to the oxide semiconductor, to solve the current problem of conductorization of the oxide semiconductor thin film transistor due to influence of a high temperature process, for example, the influence includes reducing the oxide semiconductor to a metal element so that the semiconductor is conductorized, and it no longer has the characteristics of a semiconductor. In a subsequent high temperature process, a metal oxide semiconductor layer serves as a channel layer, a chemical bond between metal and oxygen is easily broken, the formed oxygen is easy to escape; and usually, the above-described problems exist when the metal oxide semiconductor layer serves as the channel layer.

For example, FIG. 1 is a structural schematic diagram of a cross section of an oxide thin film transistor; as shown in FIG. 1, the oxide thin film transistor 10 includes a base substrate 01, a gate electrode 02 and a gate insulating layer 03, a metal oxide semiconductor layer 04, a source electrode 05, a drain electrode 06 and a passivation layer 07 provided on the base substrate 01; the passivation layer 07 on the oxide semiconductor layer 04 plays a role of protecting the metal oxide semiconductor, to avoid external impurities such as H and O from entering into the metal oxide semiconductor; and a material of the passivation layer 07 is, for example, a combination of one or more of silicon oxide, silicon nitride, and silicon oxynitride, or a laminate formed with at last one of silicon oxide, silicon nitride, and silicon oxynitride.

In some embodiments, the passivation layer (also referred to as a non-metal oxide insulating layer) is directly provided on the metal oxide semiconductor layer. In some embodiments, a metal oxide insulating layer is provided between the passivation layer and the metal oxide semiconductor layer, for example, aluminum oxide playing a role of insulating, copper oxide playing a role of insulating, etc., for example, play the role of insulating the source electrode and the drain electrode.

It should be noted that, silicon oxide and silicon oxynitride according to the embodiments of the present disclosure have obvious differences in N content. Those skilled in the art understand that a SiO film layer has a certain amount of N elements in actual tests; this is because a gas composition containing N elements needs to be used when fabricating silicon oxide, and a certain amount of the N elements is unavoidable.

First of all, silicon nitride is obtained by reacting silane and ammonia gas under appropriate conditions, a hydrogen content in the formed silicon nitride is high, and some hydrogen elements will remain in silicon nitride, which in the subsequent high temperature process, will cause hydrogen present in silicon nitride to react with free oxygen remaining in the oxide semiconductor layer 04, thereby causing loss of oxygen elements in the oxide semiconductor layer 04; further, the remaining hydrogen will beak a silicon-oxygen bond in dioxide at a high temperature, and the remaining hydrogen will consume oxygen atoms generated after the silicon-oxygen bond is broken; further, the remaining hydrogen will break a metal-oxygen bond in the oxide semiconductor layer, and then conductorize the oxide semiconductor layer. Secondly, when the passivation layer thin film is patterned by using a photoetching process to form the passivation layer 07, an etching solution used is a mixture of $NH_3F$ and HF, hydrogen elements will also be introduced, and the hydrogen elements will also react with free oxygen remaining in the oxide semiconductor layer 04, so that the oxygen elements in the oxide semiconductor layer 04 is lost.

Inventors of the present disclosure notice that structure, material, thickness, number of layers, density and so on of the insulating layer adjacent to or in contact with the oxide semiconductor layer may be adjusted, so that the insulating layer adjacent to or in contact with the oxide semiconductor layer has sufficient oxygen replenishment capability for the oxide semiconductor layer. For example, an insulating layer formed of a multi-layer insulating oxide (e.g., silicon oxide, titanium oxide, etc.) of two or three layers and so on may be provided on the oxide semiconductor layer, and a density of the multi-layer insulating oxide may be adjusted, which makes that it is more difficult for liquid or gas to enter the high-density insulating layer from the outside, which reduces a risk of hydrogen elements in an upper silicon nitride entering a lower insulating layer, and prevents free-state oxygen gas of the lower layer from volatilizing and escaping, the oxygen element in the oxide semiconductor layer is firmly fixed in the oxide semiconductor layer, to reduce the loss of the oxygen element in a subsequent high temperature annealing process, so as to ensure the stability of the characteristics of the oxide thin film transistor, and also leave more room for adjustment for the development of the subsequent processes, which makes the selection of the subsequent processes more flexible.

For example, at least one embodiment of the present disclosure provides an oxide thin film transistor, the oxide thin film transistor includes: a base substrate, an oxide semiconductor layer provided on the base substrate, and an insulating layer provided on a side of oxide semiconductor layer away from the base substrate; the insulating layer is made of oxide, the insulating layer includes a first insulating layer and a second insulating layer which are stacked; a density of the second insulating layer is greater than a density of the first insulating layer; and the second insulating layer is farther away from the base substrate than the first insulating layer. In the embodiment of the present disclosure, at least densities and thicknesses of the first insulating layer and the second insulating layer are adjusted, and oxygen in the oxide semiconductor layer is fixed in the oxide semiconductor layer, to reduce the loss of the oxygen element in the oxide semiconductor layer in the subsequent high temperature annealing process, so as to ensure the stability of the characteristics of the oxide thin film transistor.

Figure 2:
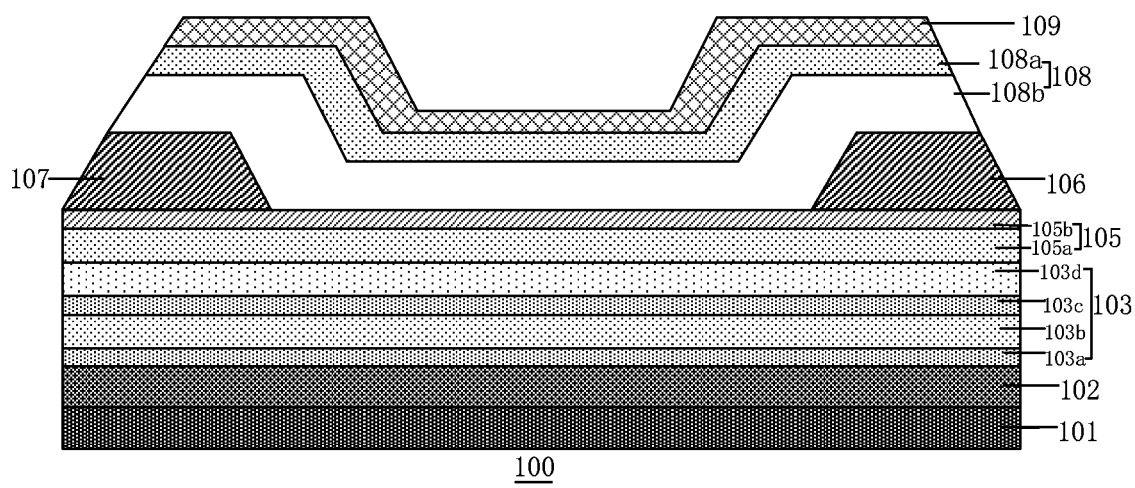
FIG. 2 is a structural schematic diagram of a cross section of an oxide thin film transistor provided by an embodiment of the present disclosure.

For example, FIG. 2 is a structural schematic diagram of a cross section of an oxide thin film transistor provided by an embodiment of the present disclosure, as shown in FIG. 2, the oxide thin film transistor 100 includes: a base substrate 101, an oxide semiconductor layer 105 provided on the base substrate 101, and an insulating layer 108 provided on a side of the oxide semiconductor layer 105 away from the base substrate 101; the insulating layer 108 is made of oxide; and the insulating layer 108 includes a first insulating layer 108b and a second insulating layer 108a which are stacked; a density of the second insulating layer 108a is greater than a density of the first insulating layer 108b, and the second insulating layer 108a is farther away from the base substrate 101 than the first insulating layer 108b; and in FIG. 2, the first insulating layer 108b in the insulating layer 108 is in contact with the oxide semiconductor layer 105.

For example, in the structure shown in FIG. 2, the insulating layer 108 is made of oxide; and the oxide includes insulating oxide such as silicon oxide ($SiO_2$), aluminum oxide ($Al_2O_3$), titanium oxide ($TiO_2$), hafnium oxide ($HfO_2$), tantalum oxide ($Ta_2O_5$) and zirconia oxide ($ZrO_2$). When the oxide is silicon dioxide, silicon dioxide may be formed by reacting silane with laughing gas (nitrogen monoxide). In the structure shown in FIG. 1, the insulating layer on and adjacent to or in contact with the semiconductor oxide is silicon nitride; silicon nitride is formed by reacting silane and ammonia gas; a hydrogen content in an oxide insulating material represented by silicon dioxide is less than a hydrogen content in a nitride insulating material; a material of the first insulating layer and a material of the second insulating layer are both oxide, and the second insulating layer 108a having a greater density is farther away from the base substrate 101, which prevents the hydrogen element in the passivation layer made of hydrogen nitride on the side of the second insulating layer 108a away from the base substrate 101 from entering the oxide semiconductor layer 105.

It should be noted that, the density of the first insulating layer 108b refers to difficulty for liquid or gas to enter the first insulating layer 108b from the outside; the greater the density of the first insulating layer 108b, the more difficult for liquid or gas to enter the first insulating layer 108b from the outside; or liquid or gas cannot enter the first insulating layer 108b at all. The density of the second insulating layer 108a refers to difficulty for liquid or gas to enter the second insulating layer 108a from the outside; the greater the density of the second insulating layer 108a, the more difficult for liquid or gas to enter the second insulating layer 108a from the outside; or liquid or gas cannot enter the second insulating layer 108a at all.

As shown in FIG. 2, the materials of the first insulating layer 108b and the second insulating layer 108a are the same or different, for example, both may be made of at least one insulating oxide such as silicon oxide ($SiO_2$), aluminum oxide ($Al_2O_3$), titanium oxide ($TiO_2$), hafnium oxide ($HfO_2$), tantalum oxide ($Ta_2O_5$) and zirconium oxide ($ZrO_2$). A content of the oxygen element in the second insulating layer 108a having a greater density is lower than a content of the oxygen element in the first insulating layer 108b.

For example, in one example, materials of the first insulating layer and the second insulating layer at least comprise O atom and Si atom.

For example, in a case that the materials of the first insulating layer 108b and the second insulating layer 108a are both silicon oxide ($SiO_2$), a reaction formula for forming the first insulating layer 108b is: $SiH_4 + 4N_2O \rightleftharpoons SiO_2 + 4N_2 + 2H_2O$, a reaction temperature is between 200° C. and 350° C., for example, if the reaction temperature used is 210° C., 230° C., 250° C., 280° C., 300° C. or 340° C., etc., it may be determined that a molar ratio of Si:O in the first insulating layer 108b is 1:2; a reaction formula for forming the second insulating layer 108a is: $SiH_4 + 4N_2O \rightleftharpoons SiO_2 + 4N_2 + 2H_2O$, a reaction temperature is between 200° C. and 350° C.; for example, if the reaction temperature used is 210° C., 230° C., 250° C., 280° C., 300° C. or 340° C., etc., it may be determined that a molar ratio of Si:O in the second insulating layer 108a is 1:1.4, and it may be determined that the molar ratio of the silicon element to the oxygen element in the second insulating layer 108a is greater than the molar ratio of the silicon element to the oxygen element in the first insulating layer 108b.

For example, by adjusting the molar ratio of the silane and the laughing gas, power and gas pressure of a reaction chamber and so on during reaction, the formed silicon dioxide may have different densities; the less the molar ratio of Si:O in the first insulating layer 108b or the second insulating layer 108a, the greater the density of the first insulating layer 108b or the second insulating layer 108a; for example, the density of the second insulating layer 108a is greater than the density of the first insulating layer 108b, and the second insulating layer 108a having a higher density is on a side of the first insulating layer 108b away from the base substrate 101, which makes it more difficult for the etching solution used in the patterning process to enter the first insulating layer 108b, thereby preventing the etching solution from entering into the oxide semiconductor layer 105, that is, the risk of damage to the oxide semiconductor layer 105 is reduced.

For example, as shown in FIG. 2, a thickness of the second insulating layer 108a is less than a thickness of the first insulating layer 108b. Since the content of oxygen element in the second insulating layer 108a having a higher density is lower than the content of oxygen element in the first insulating layer 108b, the first insulating layer 108b having a higher oxygen element content is set thicker, which may achieve a purpose of locking oxygen, so that oxygen may be replenished to the oxide semiconductor layer, so as to reduce a risk of conductorizing the oxide semiconductor layer 105.

For example, the base substrate 101 is made of a rigid material or a flexible material. For example, the rigid material includes one of rigid glass and silicon wafer. The flexible material includes one of polyethylene naphthalate, polyethylene terephthalate, polyimide, and flexible glass.

Figure 3:
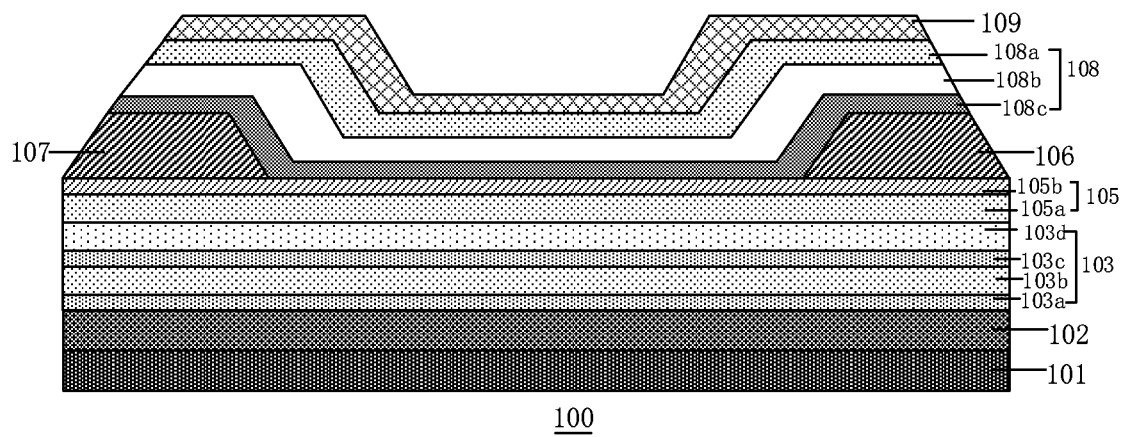
FIG. 3 is a structural schematic diagram of a cross section of another oxide thin film transistor provided by an embodiment of the present disclosure.

For example, FIG. 3 is a structural schematic diagram of a cross section of another oxide thin film transistor provided by an embodiment of the present disclosure, as shown in FIG. 3, the insulating layer 108 further includes a third insulating layer 108c, and the third insulating layer 108c is made of at least one of insulating oxides such as silicon oxide ($SiO_2$), aluminum oxide ($Al_2O_3$), titanium oxide ($TiO_2$), hafnium oxide ($HfO_2$), tantalum oxide ($Ta_2O_5$) and zirconium oxide ($ZrO_2$); the material of the third insulating layer 108c is the same as or different from the material of the first insulating layer 108b and the material of the second insulating layer 108a. The insulating layer 108 shown in FIG. 3 is a three-layer laminated structure; the third insulating layer 108c is provided on a side of the first insulating layer 108b that is close to the base substrate 101; and a density of the third insulating layer 108c is greater than the density of the first insulating layer 108b, and is less than or equal to the density of the second insulating layer 108a, so that the third insulating layer 108c may further prevent the etching solution or the hydrogen element from entering the oxide semiconductor layer 105, so as to further reduce the risk of conductorizing the oxide semiconductor layer 105.

For example, in one example, a molar ratio of Si:O in the third insulating layer 108c is 1:1.6, that is, the density of the third insulating layer 108c is between the density of the first insulating layer 108b and the density of the second insulating layer 108a. If the density of the third insulating layer 108c is too high, the oxygen content in the third insulating layer 108c will be too low, which results in insufficient oxygen replenishment capability for the first oxide semiconductor layer 105a and the second oxide semiconductor layer 105b as mentioned later, if the density of the third insulating layer 108c is too small, the capability of the third insulating layer 108c to block external water, oxygen, etching solution and so on from entering the first oxide semiconductor layer 105a and the second oxide semiconductor layer 105b is too poor.

For example, as shown in FIG. 2 and FIG. 3, the oxide semiconductor layer 105 includes a first oxide semiconductor layer 105a and a second oxide semiconductor layer 105b which are stacked; a density of the second oxide semiconductor layer 105b is greater than a density of the first oxide semiconductor layer 105b; the second oxide semiconductor layer 105b is farther away from the base substrate 101 than the first oxide semiconductor layer 105a; the second oxide semiconductor layer 105b having a greater density further prevents etching solution or hydrogen elements from entering the second oxide semiconductor layer 105b, that is, further reduces a risk of conductorizing the first oxide semiconductor layer 105a, and ensures the semiconductor characteristics of the first oxide semiconductor layer 105a.

It should be noted that, as compared with the first oxide semiconductor layer 105a, mobility of the second oxide semiconductor layer 105b with a higher density is lower; the second oxide semiconductor layer 105b is mainly used to prevent damage to the first oxide semiconductor layer 105b caused by etching; and the first oxide semiconductor layer 105a functions as a main semiconductor.

It should also be noted that, the density of the first oxide semiconductor layer 105a refers to difficulty for liquid or gas to enter the first insulating layer 108b from the outside; the greater the density of the first oxide semiconductor layer 105a, the more difficult for liquid or gas to enter the first oxide semiconductor layer 105a from the outside; or liquid or gas cannot enter the first oxide semiconductor layer 105a at all. The density of the second oxide semiconductor layer 105b refers to difficulty for liquid or gas to enter the second oxide semiconductor layer 105b from the outside; the greater the density of the second oxide semiconductor layer 105b, the more difficult for liquid or gas to enter the second oxide semiconductor layer 105b from the outside; or liquid or gas cannot enter the second oxide semiconductor layer 105b at all.

For example, materials of the first oxide semiconductor layer 105a and the second oxide semiconductor layer 105b may be the same or different. The materials of the first oxide semiconductor layer 105a and the second oxide semiconductor layer 105b include at least one of n-type semiconductor materials such as Zinc Oxide (ZnO), Indium Oxide ($In_2O_3$), Indium Zinc Oxide (IZO), Aluminum Doped Zinc Oxide (AZO), Boron Doped Oxide Zinc (BZO), Magnesium Doped Zinc Oxide (MZO), Zinc Tin Oxide (ZTO), Indium Gallium Zinc Oxide (IGZO), Indium Tin Zinc Oxide (ITZO), Gallium Zinc Oxide (GZO), Indium Tin Oxide (ITO), Hafnium Indium Zinc Oxide (HIZO) and Tin Oxide ($SnO_2$), and at least one of p-type semiconductor materials such as Stannous Oxide (SnO) and Cuprous Oxide ($Cu_2O$). For example, the first oxide semiconductor layer 105a and the second oxide semiconductor layer 105b may be formed by using a method such as magnetron sputtering, reactive sputtering, anodizing, or spin coating.

For example, a thickness of the first oxide semiconductor layer 105a may be equal or unequal to a thickness of the second oxide semiconductor layer 105b. For example, the thickness of the first oxide semiconductor layer 105a is greater than the thickness of the second oxide semiconductor layer 105b. The thickness of the first oxide semiconductor layer 105a may be 5 nm to 200 nm, and the thickness of the second oxide semiconductor layer 105b may be 3 nm to 150 nm. For example, the thickness of the first oxide semiconductor layer 105a may be 50 nm, 100 nm, 150 nm, or 200 nm, etc. The thickness of the second oxide semiconductor layer 105b may be 30 nm, 80 nm, 120 nm, or 150 nm, etc.

For example, as shown in FIG. 2 and FIG. 3, a source electrode 106 and a drain electrode 107 spaced apart from each other are arranged between the oxide semiconductor layer 105 and the insulating layer 108.

For example, materials of the source electrode 106 and the drain electrode 107 may include a combination of one or more metals such as molybdenum (Mo), chromium (Cr), titanium (Ti), aluminum (Al), aluminum alloy, and copper (Cu).

For example, in one example, the material of the source electrode 106 and the drain electrode 107 is copper-based metal. Copper metal has characteristics of low resistivity and good conductivity, which may improve a signal transmission rate of the source electrode 106 and the drain electrode 107, and improve the display quality.

For example, the copper-based metal is copper (Cu) with stable performance or a copper-based metal alloy with stable performance such as copper-zinc alloy (CuZn), copper-nickel alloy (CuNi) or copper-zinc-nickel alloy (CuZnNi).

For example, thicknesses of the source electrode 106 and the drain electrode 107 may be respectively 150 nm to 500 nm, for example, 150 nm, 220 nm, 280 nm, 320 nm, 370 nm, 400 nm, 450 nm, or 500 nm.

For example, in FIG. 2, surfaces of the source electrode 106 and the drain electrode 107 that are away from the base substrate 101 are in contact with the first insulating layer 108b, and surfaces of the source electrode 106 and the drain electrode 107 that are close to the base substrate 101 are in contact with the second oxide semiconductor layer 105b. The oxide semiconductor layer 105 and the insulating layer 108 are in contact with each other in a region between the source electrode 106 and the drain electrode 107, specifically, the second oxide semiconductor layer 105b and the first insulating layer 108b are in contact with each other in a region between the source electrode 106 and the drain electrode 107, so that the source electrode 106 and the drain electrode 107 provided in a same layer are spaced apart by a laminated structure of the first insulating layer 108b and the second insulating layer 108a.

For example, in FIG. 3, the surfaces of the source electrode 106 and the drain electrode 107 that are away from the base substrate 101 are in contact with the third insulating layer 108c; and the surfaces of the source electrode 106 and the drain electrode 107 that are close to the base substrate 101 are in contact with the second oxide semiconductor layer 105b. The oxide semiconductor layer 105 and the insulating layer 108 are in contact with each other in a region between the source electrode 106 and the drain electrode 107, specifically, the second oxide semiconductor layer 105b and the third insulating layer 108c are in contact with each other in a region between the source electrode 106 and the drain electrode 107, so that the source electrode 106 and the drain electrode 107 provided in a same layer are spaced apart by a laminated structure of the first insulating layer 108b, the second insulating layer 108a and the third insulating layer 108c.

For example, as shown in FIG. 2 and FIG. 3, a gate electrode 102 is provided between the base substrate 101 and the oxide semiconductor layer 105; a gate insulating layer 103 is provided between the gate electrode 102 and the oxide semiconductor layer 105; and a material of a portion of the gate insulating layer 103 that is in contact with the oxide semiconductor layer 105 is an oxide insulating material. The gate insulating layer 103 may be a single-layer structure or a multi-layer laminated structure.

For example, the material of the gate electrode 102 may be a combination of copper and other metals, for example, copper/molybdenum (Cu/Mo), copper/titanium (Cu/Ti), a copper/molybdenum/titanium alloy (Cu/MoTi), a copper/molybdenum/tungsten alloy (Cu/MoW), a copper/molybdenum/niobium alloy (Cu/MoNb), etc. The material of the gate electrode 102 may also be a chromium-based metal or a combination of chromium and other metals, for example, chromium/molybdenum (Cr/Mo), chromium/titanium (Cr/Ti), a chromium/molybdenum/titanium alloy (Cr/MoTi) etc., for example, a thickness of the gate electrode is 1,000 Å to 10,000 Å.

For example, in FIG. 2 and FIG. 3, on a main surface of the base substrate 101 on which the respective film layer structures are provided, in a direction from a side close to the base substrate 101 to a side away from the base substrate 101, the gate insulating layer 103 includes a first gate insulating layer 103a, a second gate insulating layer 103b, a third gate insulating layer 103c and a fourth gate insulating layer 103d which are stacked, that is, the gate insulating layer 103 is a four-layer laminated structure; a layer structure of the gate insulating layer 103 in contact with the oxide semiconductor layer 105 is a fourth gate insulating layer 103d; a material of the fourth gate insulating layer 103d is at least one of insulating oxide such as silicon oxide ($SiO_2$), aluminum oxide ($Al_2O_3$), titanium oxide ($TiO_2$), hafnium oxide ($HfO_2$), tantalum oxide ($Ta_2O_5$) and zirconium oxide ($ZrO_2$); the materials of the first gate insulating layer 103a, the second gate insulating layer 103b and the third gate insulating layer 103c are all insulating nitride, for example, the insulating nitride includes at least one of silicon nitride ($SiN_x$), aluminum nitride ($AlN_x$), and so on.

For example, a thickness of the second gate insulating layer 103b is greater than a thickness of the first gate insulating layer 103a and is greater than a thickness of the third gate insulating layer 103c; and the thickness of the first gate insulating layer 103a and the thickness of the third gate insulating layer 103c may be respectively 50 Å to 100 Å; a density of the first gate insulating layer 103a and a density of the third gate insulating layer 103c are both greater than a density of the second gate insulating layer 103b; the hydrogen content in the first gate insulating layer 103a and the hydrogen content in the third gate insulating layer 103c are low; and contents of silane and ammonia in a used reaction raw material are low, so that the first gate insulating layer 103a and the third gate insulating layer 103c cannot be formed on a large scale; in a structure of a display panel including the thin film transistor, on a side of the gate electrode 102 that is close to the base substrate 101 has a transparent conductive metal oxide formed of indium tin oxide, etc., so in order to prevent the transparent conductive metal oxide from being reduced, the first gate insulating layer 103a needs to be formed under a low hydrogen condition; in order to prevent the hydrogen elements in the third gate insulating layer 103c from diffusing into the oxide semiconductor layer 105 to cause the problem of conductorization, the third gate insulating layer 103c needs to be formed under a low hydrogen condition. The thickness of the second gate insulating layer 103b is 2,000 Å to 4,000 Å; forming the second gate insulating layer 103b requires high-speed deposition to improve a film formation rate, so as to realize large-scale production; however, the second gate insulating layer 103b is formed by using a high content of silane, and a content of silicon-hydrogen bonds is high.

It should be noted that, a dielectric constant of silicon dioxide is 3.9 F/m; a dielectric constant of silicon nitride is 7 F/m; under a condition that silicon dioxide and silicon nitride have a same film thickness, the silicon nitride has a higher capacitance, for example, a capacitance formula is $C=\varepsilon S/4\pi kd$, where, $\varepsilon$ is a dielectric constant, and a method for increasing capacitance is: using a material with a high dielectric constant and reducing a film thickness of the material with a high dielectric constant; however, since an electric field formula is $E=U/d$, where d is a film thickness, when the film thickness is reduced, an electric field intensity is increased, resulting in easy breakdown between electrodes, so the material with a high dielectric constant is usually used to increase capacitance. For example, if the silicon nitride layer is not provided, and the gate insulating layer is all set as a silicon oxide layer, the thickness of the silicon oxide layer to be formed is very large; and the increase of the thickness of the silicon oxide layer will reduce mobility of the thin film transistor; meanwhile, if there is no silicon nitride in a lower layer, sodium ions or potassium ions in the base substrate will also affect the characteristics of the thin film transistor, resulting in the decline of stability, which in turn will also affect mobility of the finally formed oxide thin film transistor.

Figure 4:
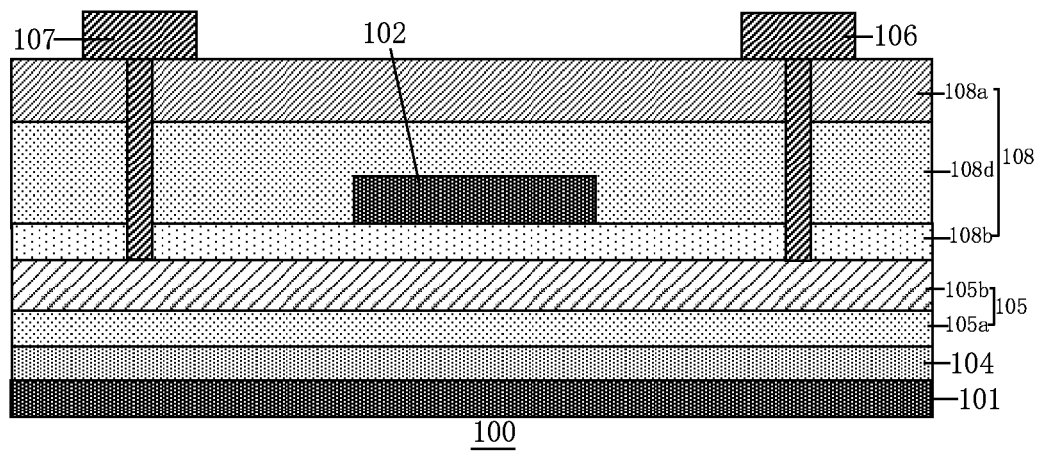
FIG. 4 is a structural schematic diagram of a cross section of still another oxide thin film transistor provided by an embodiment of the present disclosure.

For example, FIG. 4 is a structural schematic diagram of a cross section of still another oxide thin film transistor provided by an embodiment of the present disclosure; different from the structure of the bottom gate type oxide thin film transistor shown in FIG. 2 and FIG. 3, the oxide thin film transistor in FIG. 4 is a top gate type thin film transistor; in the oxide thin film transistor 100 shown in FIG. 4, a gate electrode 102 is provided between a layer where the source electrode 106 and the drain electrode 107 are located and the oxide semiconductor layer 105; the insulating layer 108 further includes a fourth insulating layer 108d provided between the first insulating layer 108b and the second insulating layer 108a; the gate electrode 102 is provided between the fourth insulating layer 108d and the first insulating layer 108b; and the oxide semiconductor layer 105 includes the first oxide semiconductor layer 105a and the second oxide semiconductor layer 105b.

For example, a material of the fourth insulating layer 108d is at least one of insulating oxide such as silicon oxide ($SiO_2$), aluminum oxide ($Al_2O_3$), titanium oxide ($TiO_2$), hafnium oxide ($HfO_2$), tantalum oxide ($Ta_2O_5$), and zirconium oxide ($ZrO_2$); a thickness of the fourth insulating layer 108d ranges from 10 nm to 180 nm; for example, the thickness of the fourth insulating layer 108d is 15 nm, 35 nm, 45 nm, 90 nm, 100 nm, 130 nm, 160 nm, or 180 nm and so on.

Figure 5:
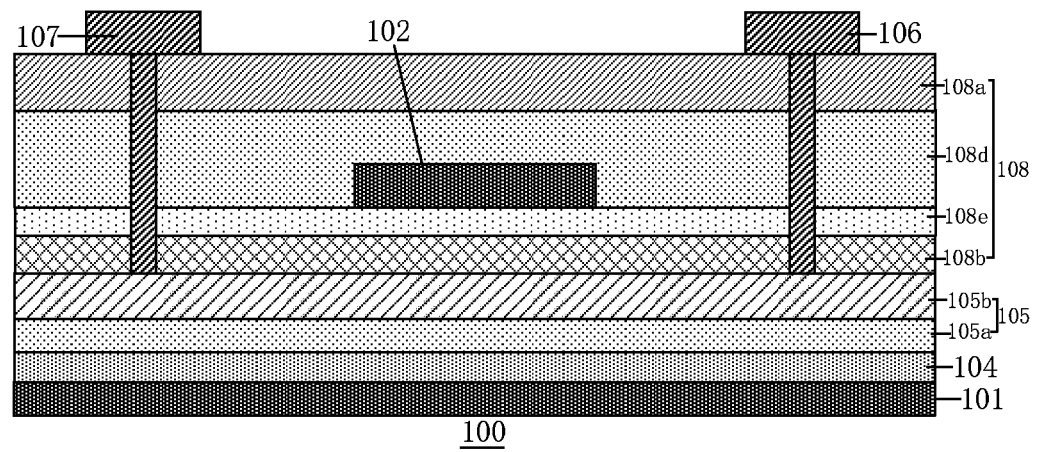
FIG. 5 is a structural schematic diagram of a cross section of still another oxide thin film transistor provided by an embodiment of the present disclosure.

For example, FIG. 5 is a structural schematic diagram of a cross section of still another oxide thin film transistor provided by an embodiment of the present disclosure; a structure of the oxide thin film transistor shown in FIG. 5 is also a top gate type structure; as shown in FIG. 5, the insulating layer 108 further includes a fifth insulating layer 108e provided between the first insulating layer 108b and the fourth insulating layer 108d; a density of the fifth insulating layer 108e is greater than the density of the first insulating layer 108a, which thus, may prevent etching solution or the hydrogen element used for forming the source electrode 106 and the drain electrode 107 from entering the oxide semiconductor layer 105.

For example, the fifth insulating layer 108e is made of a same material as the first insulating layer 108b, which may be at least one of insulating oxide such as silicon oxide ($SiO_2$), aluminum oxide ($Al_2O_3$), titanium oxide ($TiO_2$), hafnium oxide ($HfO_2$), tantalum oxide ($Ta_2O_5$) and zirconium oxide ($ZrO_2$); but the density of the fifth insulating layer 108e is greater than the density of the fourth insulating layer 108d. For example, the thickness of the first insulating layer 108a may be equal or unequal to a thickness of the fifth insulating layer 108e; and in one example, the thickness of the first insulating layer 108a is greater than the thickness of the fifth insulating layer 108e. For example, the thickness of the first insulating layer 108a may be 20 nm, 45 nm, 65 nm, 90 nm, 100 nm, or 200 nm, etc.; and the thickness of the fifth insulating layer 108e may range from 8 nm to 150 nm, for example, may be 10 nm, 15 nm, 30 nm, 50 nm, 80 nm, 120 nm, or 150 nm and so on.

For example, in one example, both the material of the fifth insulating layer 108e and the material of the first insulating layer 108b contain Si and O.

Figure 6:
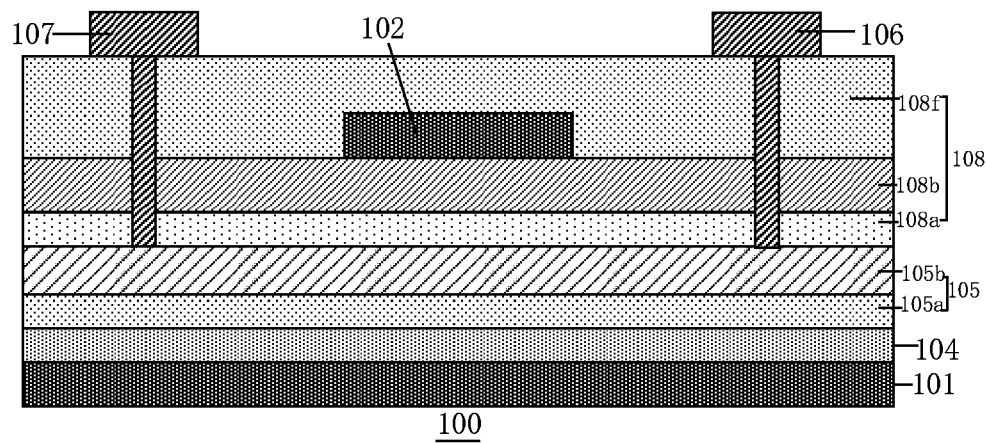
FIG. 6 is a structural schematic diagram of a cross section of still another oxide thin film transistor provided by an embodiment of the present disclosure.

For example, FIG. 6 is a structural schematic diagram of a cross section of still another oxide thin film transistor provided by an embodiment of the present disclosure; as shown in FIG. 6, a gate electrode 102 is arranged between a layer where the source electrode 106 and the drain electrode 107 are located and the oxide semiconductor layer 105; the insulating layer 108 further includes a sixth insulating layer 108f provided on a side of the second insulating layer 108b that is away from the base substrate 101; and the gate electrode 102 is provided between the sixth insulating layer 108f and the first insulating layer 108b. For example, a thickness of the sixth insulating layer 108f is greater than the thickness of the first insulating layer 108a, and is greater than the thickness of the second insulating layer 108b. The material of the sixth insulating layer 108f may be at least one of insulating oxide such as silicon oxide ($SiO_2$), aluminum oxide ($Al_2O_3$), titanium oxide ($TiO_2$), hafnium oxide ($HfO_2$), tantalum oxide ($Ta_2O_5$), and zirconium oxide ($ZrO_2$); and a density of the sixth insulating layer 108f may be less than the density of the first insulating layer 108a.

It should be noted that, the density of the fifth insulating layer 108e refers to difficulty for liquid or gas to enter the fifth insulating layer 108e from the outside; the greater the density of the fifth insulating layer 108e, the more difficult for liquid or gas to enter the fifth insulating layer 108e from the outside; or liquid or gas cannot enter the fifth insulating layer 108e at all. The density of the sixth insulating layer 108f refers to difficulty for liquid or gas to enter the sixth insulating layer 108f from the outside; the greater the density of the sixth insulating layer 108f, the more difficult for liquid or gas to enter the sixth insulating layer 108f from the outside; or liquid or gas cannot enter the sixth insulating layer 108f at all.

For example, taking FIG. 3 as an example, the insulating layer 108 includes the first insulating layer 108b, the second insulating layer 108a and the third insulating layer 108c that are sequentially stacked. Single layers of the first insulating layer 108b, the second insulating layer 108a and the third insulating layer 108c included in the insulating layer 108 is tested for an oxygen release amount by using a thermal volatile mass spectrometer (model: ESCO TDS1200); and test results are as follows:

TABLE 1

Comparison chart of oxygen release amounts from
single layers and laminated insulating layers

|  | Structure and thickness | Oxygen release amount/cm² | |
|---|---|---|---|
|  |  | 70° C. to 550° C. | 200° C. to 350° C. |
| Single layers | Second insulating layer with the thickness of 500 Å | $0.75 \times 10^{14}$ | $1.0 \times 10^{13}$ |
|  | First insulating layer with the thickness of 3,000 Å | $5.9 \times 10^{14}$ | $5.6 \times 10^{13}$ |
|  | Third insulating layer with the thickness of 500 Å | $1.28 \times 10^{14}$ | $2.2 \times 10^{13}$ |
| Laminated insulating layers | Second insulating layer with the thickness of 500 Å/ First insulating layer with the thickness of 3,000 Å/ Third insulating layer with the thickness of 500 Å | $7.8 \times 10^{14}$ | $2.8 \times 10^{13}$ |
|  | Second insulating layer with the thickness of 500 Å/ First insulating layer with the thickness of 2,000 Å/ Third insulating layer with the thickness of 500 Å | $5.8 \times 10^{14}$ | $3.0 \times 10^{13}$ |
|  | Second insulating layer with the thickness of 500 Å/ First insulating layer with the thickness of 1,000 Å/ Third insulating layer with the thickness of 500 Å | $3.1 \times 10^{14}$ | $1.6 \times 10^{13}$ |

As shown in Table 1 above, when the second insulating layer with the thickness of 500 Å, the first insulating layer with the thickness of 3,000 Å, and the third insulating layer with the thickness of 500 Å are stacked, and heated to a temperature of 550° C., the oxygen release amount of the second insulating layer with the thickness of 500 Å, the first insulating layer with the thickness of 3,000 Å and the third insulating layer with the thickness of 500 Å which are stacked is substantially equal to a sum of oxygen release amounts of the second insulating layer with the thickness of 500 Å, the first insulating layer with the thickness of 3,000 Å, and the third insulating layer with the thickness of 500 Å as single layers in a same temperature range; and at 550° C., oxygen in the first insulating layer, the second insulating layer and the third insulating layer as described above is substantially released completely. For example, in a temperature range from 200° C. to 350° C., the oxygen release amounts in the second insulating layer with the thickness of 500 Å, the first insulating layer with the thickness of 3,000 Å and the third insulating layer with the thickness of 500 Å as single layers are respectively $1.0 \times 10^{13}$, $5.6 \times 10^{13}$ and $2.2 \times 10^{13}$; when the second insulating layer with the thickness of 500 Å, the first insulating layer with the thickness of 3,000 Å and the third insulating layer with the thickness of 500 Å which are stacked, and heated to a temperature of 350° C., the oxygen release amount of the second insulating layer with the thickness of 500 Å, the first insulating layer with the thickness of 3,000 Å and the third insulating layer with the thickness of 500 Å which are stacked is $2.8 \times 10^{13}$, which is much less than a sum of oxygen release amounts of the second insulating layer with the thickness of 500 Å, the first insulating layer with the thickness of 3,000 Å and the third insulating layer with the thickness of 500 Å as single layers in a same temperature range; so, in a same heating temperature range, the oxygen release amount of the laminated structure formed by stacking the second insulating layer with the thickness of 500 Å, the first insulating layer with the thickness of 3,000 Å and the third insulating layer with the thickness of 500 Å is significantly reduced, which indicates that in a commonly used high temperature process (at a temperature of 200° C. to 350° C.), the stacked insulating layers have a good oxygen locking effect. Similarly, the laminated structure formed by the second insulating layer with the thickness of 500 Å, the first insulating layer with the thickness of 2,000 Å and the third insulating layer with the thickness of 500 Å also has good oxygen locking capability; and the laminated structure formed by the second insulating layer with the thickness of 500 Å, the first insulating layer with the thickness of 1,000 Å and the third insulating layer with the thickness of 500 Å also has good oxygen locking capability.

According to the same test, the laminated structure of other insulating layers provided by the embodiments of the present disclosure, for example, the laminated structure of the second insulating layer with the thickness of 500 Å/the first insulating layer with the thickness of 2,000 Å/the third insulating layer with the thickness of 500 Å and the laminated structure of the second insulating layer with the thickness of 500 Å/the first insulating layer with the thickness of 1,000 Å/the third insulating layer with the thickness of 500 Å also have good oxygen locking capability, which are omitted herein.

Figure 7A:
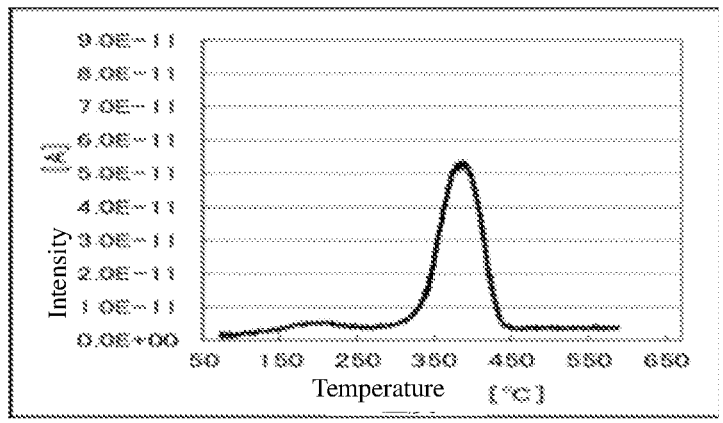
FIG. 7A to FIG. 7D are test graphs of oxygen release capability of a laminated structure of insulating layers and respective single layers shown in FIG. 3.
Figure 7B:
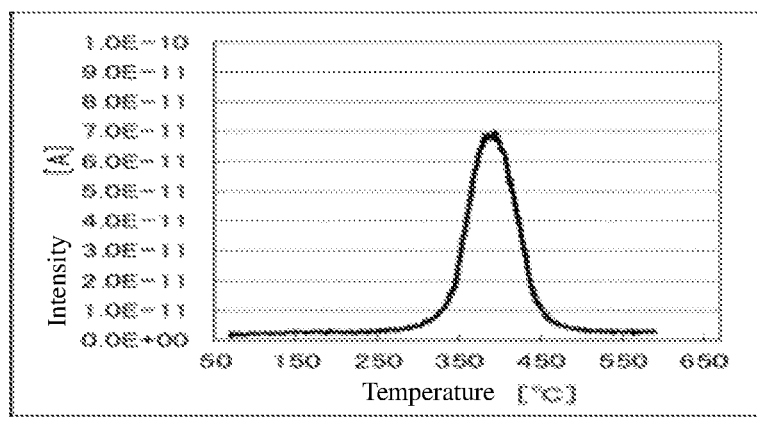
Figure 7C:
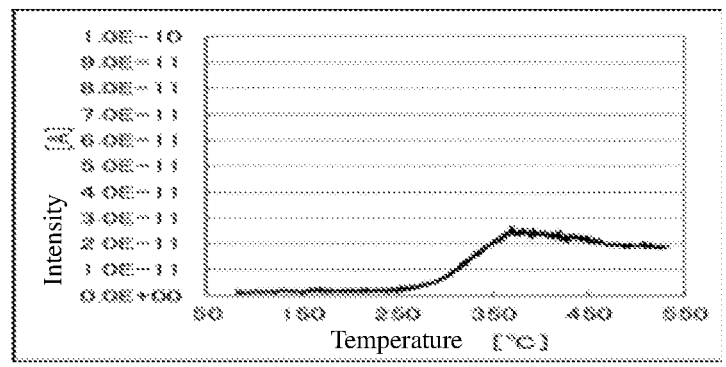
Figure 7D:
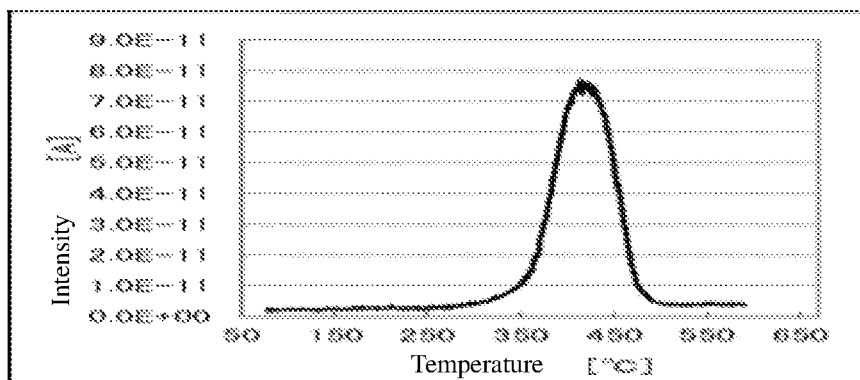

For example, FIG. 7A to FIG. 7D are test graphs of oxygen release capability of a laminated structure of insulating layers and respective single layers shown in FIG. 3; as shown in FIG. 7A, an oxygen release amount of the third insulating layer with the thickness of 500 Å as a single layer reaches its maximum when a heating temperature reaches 397° C. As shown in FIG. 7B, an oxygen release amount of the first insulating layer with the thickness of 3,000 Å as a single layer reaches its maximum when a heating temperature reaches 398° C. As shown in FIG. 7C, an oxygen release amount of the second insulating layer with the thickness of 500 Å as a single layer reaches its maximum when a heating temperature reaches 389° C., and since the density of the second insulating layer with the thickness of 500 Å is the greatest, a maximum oxygen release amount of the second insulating layer with the thickness of 500 Å as a single layer is less than a maximum oxygen release amount of the third insulating layer with the thickness of 500 Å as a single layer, and is less than a maximum oxygen release amount of the first insulating layer with the thickness of 3,000 Å as a single layer. As shown in FIG. 7D, the oxygen release amount of the laminated structure of the second insulating layer with the thickness of 500 Å, the first insulating layer with the thickness of 3,000 Å and the third insulating layer with the thickness of 500 Å reaches its maximum when a heating temperature reaches 423° C.; a maximum oxygen release amount thereof is significantly lower than a sum of the maximum oxygen release amounts of the second insulating layer with the thickness of 500 Å, the first insulating layer with the thickness of 3,000 Å and the third insulating layer with the thickness of 500 Å as single layers; the oxygen release amount of the second insulating layer with the thickness of 500 Å, the first insulating layer with the thickness of 3,000 Å and the third insulating layer with the thickness of 500 Å which are stacked reaches its maximum when a heating temperature reaches 423° C.; and the temperature is significantly higher than the temperature when the oxygen release amounts of the second insulating layer with the thickness of 500 Å, the first insulating layer with the thickness of 3,000 Å and the third insulating layer with the thickness of 500 Å as single layers reach their maximum, that is, as compared with the second insulating layer with the thickness of 500 Å, the first insulating layer with the thickness of 3,000 Å and the third insulating layer with the thickness of 500 Å as single layers, the laminated structure of the second insulating layer with the thickness of 500 Å, the first insulating layer with the thickness of 3,000 Å and the third insulating layer with the thickness of 500 Å requires an increase of 20° C. to 30° C. in temperature to make the oxygen release amount reach the maximum.

For example, in one example, when the temperature is higher than 300° C., an oxygen element release amount of the first insulating layer is higher than an oxygen element release amount of the second insulating layer.

For example, in another example, when the temperature is higher than 300° C., the oxygen element release amount of the first insulating layer is higher than the oxygen element release amount of the second insulating layer or the third insulating layer.

Figure 8A:
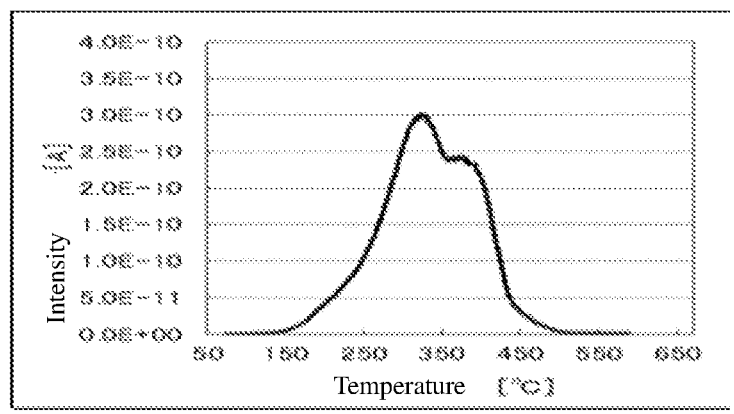
FIG. 8A to FIG. 8D are test graphs of nitric oxide release capability of the laminated structure of insulating layers and the single layers shown in FIG. 3.
Figure 8B:
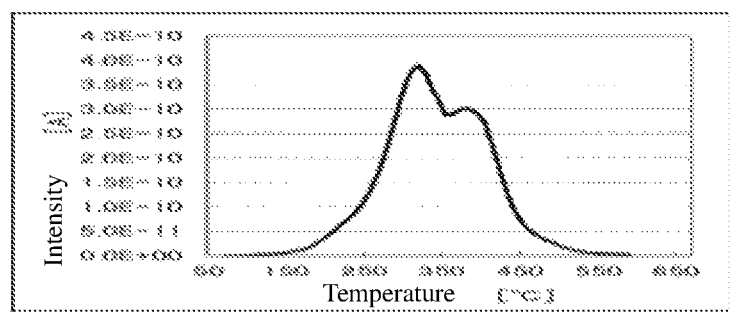
Figure 8C:
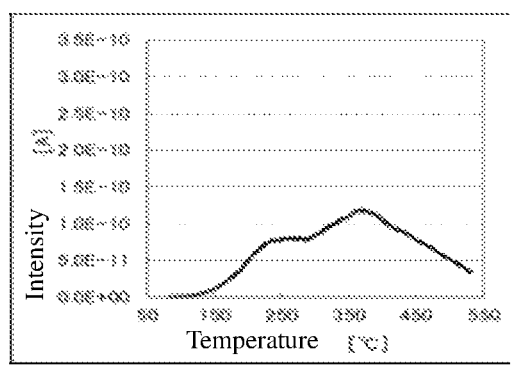
Figure 8D:
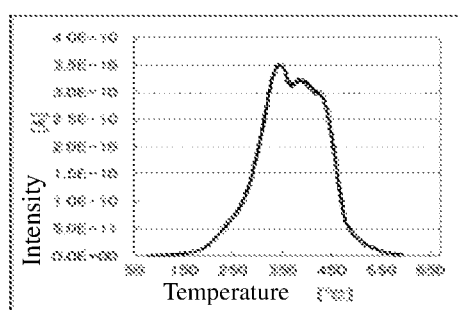

For example, FIG. 8A to FIG. 8D are test graphs of nitric oxide release capability of the laminated structure of insulating layers and the single layers shown in FIG. 3; as shown in FIG. 8A, a nitric oxide release amount of the third insulating layer with the thickness of 500 Å with a single layer structure reaches its maximum when the heating temperature reaches 300° C. As shown in FIG. 8B, a nitric oxide release amount of the first insulating layer with the thickness of 3,000 Å with a single layer structure reaches its maximum when the heating temperature reaches 301° C. As shown in FIG. 8C, a nitric oxide release amount of the second insulating layer 500 Å with a single layer structure reaches its maximum when the heating temperature reaches 370° C., and since the density of the second insulating layer with the thickness of 500 Å is the greatest, a maximum nitric oxide release amount of the second insulating layer with the thickness of 500 Å with a single layer structure is less than a maximum nitric oxide release amount of the third insulating layer with the thickness of 500 Å with a single layer structure, and is less than a maximum nitric oxide release amount of the first insulating layer with the thickness of 3,000 Å with a single layer structure. As shown in FIG. 8D, a nitric oxide release amount of the laminated structure of the second insulating layer with the thickness of 500 Å, the first insulating layer with the thickness of 3,000 Å and the third insulating layer with the thickness of 500 Å reaches its maximum when the heating temperature reaches 335° C., and the maximum nitric oxide release amount is significantly lower than a sum of maximum nitric oxide release amounts of the second insulating layer with the thickness of 500 Å, the first insulating layer with the thickness of 3,000 Å and the third insulating layer with the thickness of 500 Å as single layers respectively; the nitric oxide release amount of the laminated structure of the second insulating layer with the thickness of 500 Å, the first insulating layer with the thickness of 3,000 Å and the third insulating layer with the thickness of 500 Å reaches its maximum when the heating temperature reaches 345° C., and the temperature is significantly higher than the temperature when the second insulating layer with the thickness of 500 Å, the first insulating layer with the thickness of 3,000 Å and the third insulating layer with the thickness of 500 Å as single layers reaches their maximum nitric oxide release amounts.

For example, a density of a film layer may be evaluated by a wet etching rate; the etching solution used is a mixture of $NH_3F:HF$, mass percentages of $NH_3F$ and HF are respectively 29.8% to 30.2% and 5.9% to 6.1%; and when the wet etching rate is higher than 60 Å/s, the oxygen locking effect cannot be achieved.

For example, in the structure shown in FIG. 3, in a case that the material of the second insulating layer 108a is silicon dioxide, a wet etching rate of the second insulating layer 108a is 35 Å/s to 50 Å/s, and a wet etching rate of the third insulating layer is 45 Å/s to 70A/s; in a case that the third insulating layer is too loose, breakage will occur to the third insulating layer; in a case that the insulating layer is a three-layer laminated structure, and the density of each layer structures of the insulating layer are gradually reduced from a direction away from the base substrate to a direction close to the base substrate, it is beneficial to supplement oxygen into the oxide semiconductor layer from the direction away from the base substrate to the direction close to the base substrate. Since an oxygen replenishment process is required after subsequent formation of the passivation layer, if the density of the second insulating layer 108a is too high or the thickness of the second insulating layer 108a is too large, it is not favorable for the oxygen replenishment process; so the thickness of the second insulating layer 108a is limited to 100 Å to 2,000 Å, for example, in one example, the thickness of the first insulating layer 108b is 1,000 Å to 4,000 Å, the thickness of the second insulating layer 108a is 100 Å to 2,000 Å, and the thickness of the third insulating layer 108c is 700 Å to 1,000 Å. For example, in one example, the thickness of the second insulating layer 108b is 300 Å to 500 Å.

For example, in one example, the etching solution used for etching the first insulating layer 108b, the second insulating layer 108a and the third insulating layer 108c is a mixed solution of $NH_3F$ and HF; in the mixed solution of $NH_3F$ and HF, mass percentages of $NH_3F$ and HF are respectively 29.8% to 30.2% and 5.9% to 6.1%; a difference between the etching rates of the first insulating layer 108b and the second insulating layer 108a is 20 Å/s to 40 Å/s; a difference between the etching rates of the first insulating layer 108b and the third insulating layer 108c is 10 Å/s to 20 Å/s; the etching rate for etching the first insulating layer 108b is 55 Å/s to 90 Å/s; the etching rate for etching the second insulating layer 108a is 35 Å/s to 50 Å/s, and the etching rate for etching the third insulating layer 108c is 45 Å/s to 70 Å/s.

Figure 9:
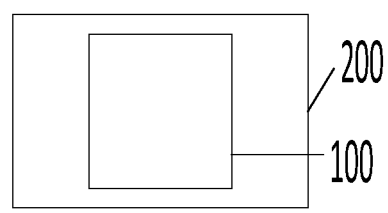
FIG. 9 is a block diagram of a display device provided by an embodiment of the present disclosure.

At least one embodiment of the present disclosure further provides a display device, which includes the oxide thin film transistor according to any one of the above-mentioned embodiments. For example, FIG. 9 is a block diagram of a display device provided by an embodiment of the present disclosure. As shown in FIG. 9, the display device 200 includes the oxide thin film transistor 100; and the display device 200 may be a liquid crystal display device, an electronic paper, an Organic Light-Emitting Diode (OLED) display device, an Active-Matrix Organic Light-Emitting Diode (AMOLED) display device, a mobile phone, a tablet computer, a television, a monitor, a notebook computer, a digital photo frame or a navigator, and any other product or component having a display function.

At least one embodiment of the present disclosure further provides a preparation method of an oxide thin film transistor, and the preparation method includes: providing a base substrate; forming an oxide semiconductor layer on the base substrate; forming a first insulating layer on a side of the oxide semiconductor layer away from the base substrate; and forming a second insulating layer on a side of the first insulating layer away from the base substrate; in which a density of the second insulating layer is greater than a density of the first insulating layer, and the second insulating layer is farther away from the base substrate than the first insulating layer. In the embodiment of the present disclosure, at least the densities and the thicknesses of the first insulating layer and the second insulating layer are adjusted, and oxygen in the oxide semiconductor layer is fixed in the oxide semiconductor layer, to reduce loss of the oxygen element in the oxide semiconductor layer in a subsequent high temperature annealing process, so as to ensure stability of characteristics of the oxide thin film transistor.

Figure 10:
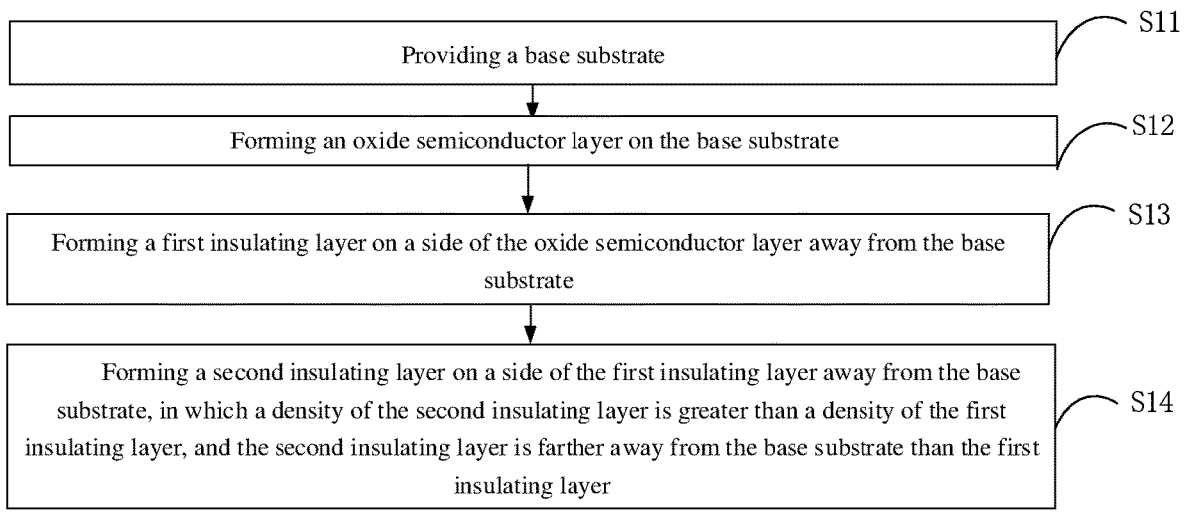
FIG. 10 is a flow chart of a preparation method of an oxide thin film transistor provided by an embodiment of the present disclosure.

For example, FIG. 10 is a flow chart of a preparation method of a thin film transistor provided by an embodiment of the present disclosure, as shown in FIG. 10, the preparation method includes the steps as follows.

S11: providing a base substrate.

S12: forming an oxide semiconductor layer on the base substrate.

S13: forming a first insulating layer on a side of the oxide semiconductor layer away from the base substrate.

S14: forming a second insulating layer on a side of the first insulating layer away from the base substrate, in which a density of the second insulating layer is greater than a density of the first insulating layer, and the second insulating layer is farther away from the base substrate than the first insulating layer.

For example, the preparation method further includes: applying a third insulating layer thin film on a side of the first insulating layer that is close to the base substrate to form a third insulating layer, in which a density of the third insulating layer is greater than the density of the first insulating layer.

For example, in the preparation method, the forming an oxide semiconductor layer includes: applying a first oxide semiconductor layer thin film and performing a patterning process to form the first oxide semiconductor layer, applying a second oxide semiconductor layer thin film on the first oxide semiconductor layer and performing a patterning process to form a second oxide semiconductor layer, in which a density of the second oxide semiconductor layer is greater than a density of the first oxide semiconductor layer.

For example, the preparation method further includes: applying a metal electrode thin film on a side of the oxide semiconductor layer away from the base substrate, and performing a patterning process on the metal electrode thin film to form a source electrode and a drain electrode spaced apart from each other, in which the oxide semiconductor layer is in contact with the insulating layer in a region between the source electrode and the drain electrode.

For example, in the preparation method provided by at least one embodiment of the present disclosure, before the forming an oxide semiconductor layer, the method further includes: applying a gate electrode thin film on the base substrate, performing a patterning process on the gate electrode thin film to form a gate electrode, and applying a gate insulating layer thin film on the gate electrode to form a gate insulating layer, in which a material of a portion of the gate insulating layer that is in contact with the oxide semiconductor layer is an oxide insulating material.

Figure 11:
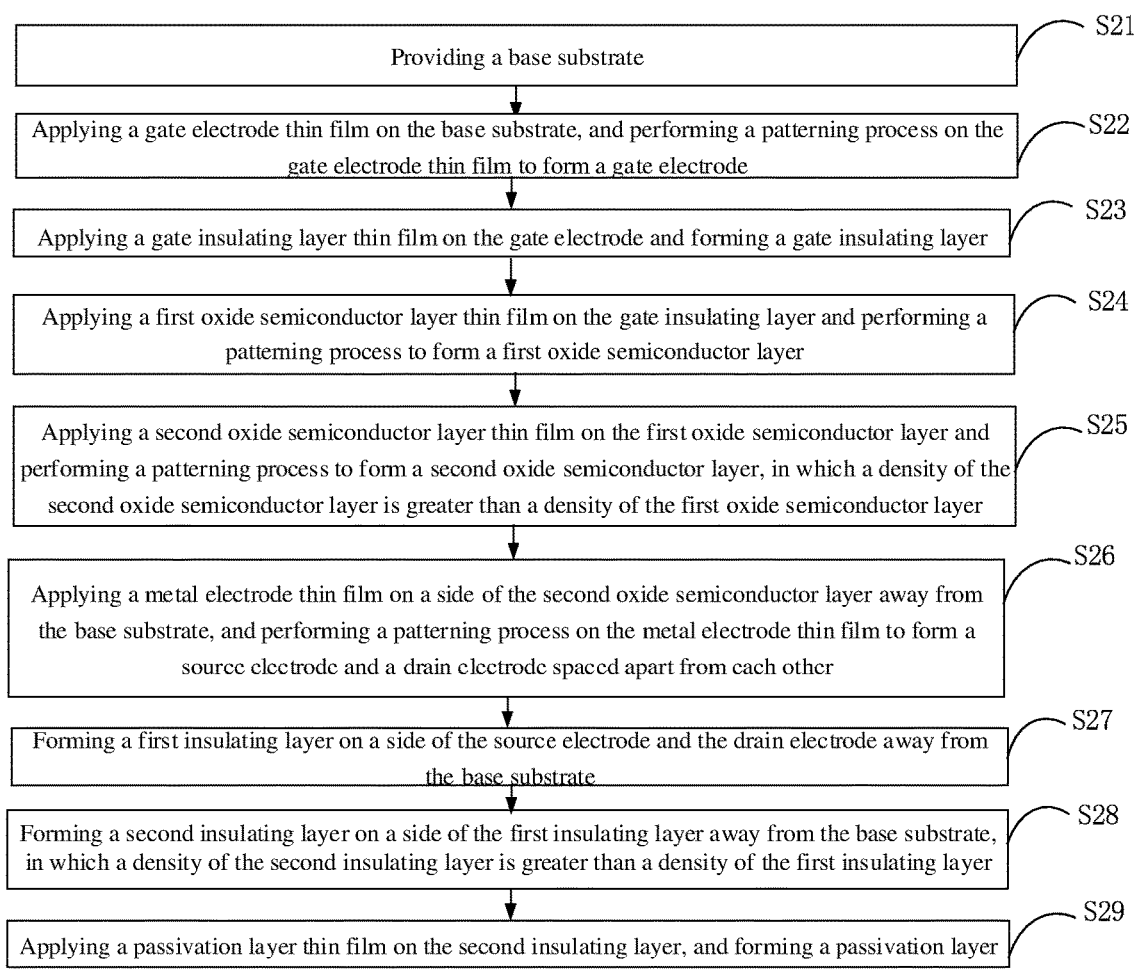
FIG. 11 is a flow chart of another preparation method of a thin film transistor provided by an embodiment of the present disclosure.

For example, FIG. 11 is a flow chart of another preparation method of a thin film transistor provided by an embodiment of the present disclosure, as shown in FIG. 11, the preparation method includes the steps as follows.

S21: providing a base substrate.

S22: applying a gate electrode thin film on the base substrate, and performing a patterning process on the gate electrode thin film to form a gate electrode.

S23: applying a gate insulating layer thin film on the gate electrode and forming a gate insulating layer.

S24: applying a first oxide semiconductor layer thin film on the gate insulating layer and performing a patterning process to form a first oxide semiconductor layer.

S25: applying a second oxide semiconductor layer thin film on the first oxide semiconductor layer and performing a patterning process to form a second oxide semiconductor layer, in which a density of the second oxide semiconductor layer is greater than a density of the first oxide semiconductor layer.

S26: applying a metal electrode thin film on a side of the second oxide semiconductor layer away from the base substrate, and performing a patterning process on the metal electrode thin film to form a source electrode and a drain electrode spaced apart from each other.

S27: forming a first insulating layer on a side of the source electrode and the drain electrode away from the base substrate.

S28: forming a second insulating layer on a side of the first insulating layer away from the base substrate, in which a density of the second insulating layer is greater than a density of the first insulating layer.

For example, the oxide semiconductor layer and the insulating layer are in contact with each other in a region between the source electrode and the drain electrode.

S29: applying a passivation layer thin film on the second insulating layer, and forming a passivation layer.

For example, FIG. 12A to FIG. 12I are process charts of a preparation method of a thin film transistor provided by an embodiment of the present disclosure.

Figure 12A:
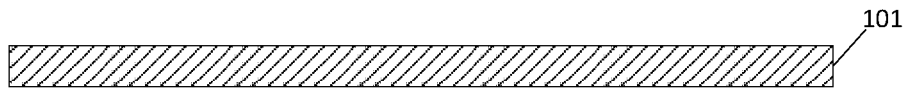
FIG. 12A to FIG. 12I are process charts of a preparation method of a thin film transistor provided by an embodiment of the present disclosure.

As shown in FIG. 12A, a base substrate 101 is provided, and the base substrate 101 is made of a rigid material or a flexible material. For example, the rigid material includes one of rigid glass and silicon wafer. The flexible material includes one of polyethylene naphthalate, polyethylene terephthalate, polyimide, and flexible glass.

Figure 12B:
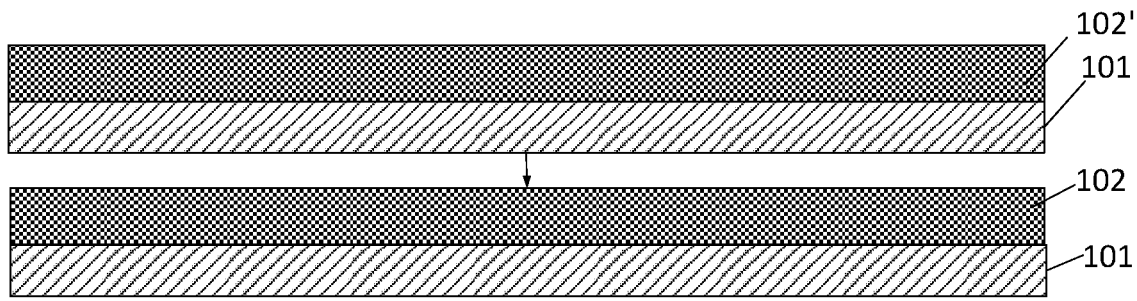

As shown in FIG. 12B, a gate electrode thin film 102' is applied on the base substrate 101, and a patterning process is performed on the gate electrode thin film 102' to form the gate electrode 102.

For example, the depositing a gate electrode thin film 102' on the base substrate 101 includes forming the gate electrode thin film 102' made of a metal material by using a method such as magnetron sputtering, electron beam evaporation or thermal evaporation, or forming the gate electrode thin film 102' made of a transparent conductive material by using a method such as magnetron sputtering or optical coating, next coating a layer of photoresist (not shown) on the gate electrode thin film 102', and forming a pattern of the gate electrode 102 through processes such as exposing, developing, etching, and stripping. For example, the photoresist may be coated by spin coating, blade coating, or roll coating.

For example, the material of the gate electrode 102 can refer to the above-mentioned relevant descriptions, which are omitted herein.

Figure 12C:
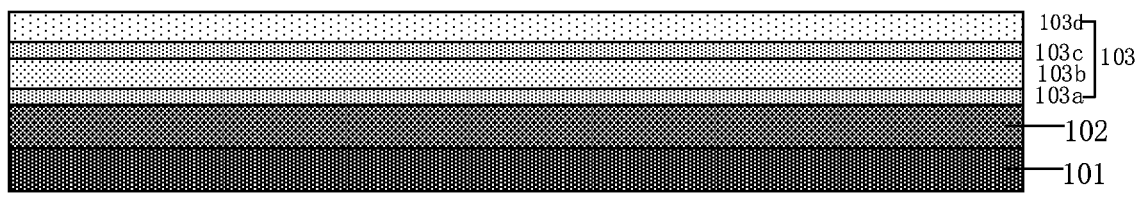

As shown in FIG. 12C, a gate insulating layer thin film is applied on the gate electrode 102 to form a gate insulating layer 103.

For example, a layer of photoresist (not shown) is coated on the gate insulating layer thin film, and processes such as exposing, developing, etching and stripping the photoresist are performed to form the pattern of the gate insulating layer 103. For example, the photoresist may be coated by spin coating, blade coating, or roll coating.

For example, the gate insulating layer 103 may be a multi-layer laminated structure, and a formation process of each layer in the multi-layer laminated structure is: firstly coating a layer of photoresist on the corresponding gate insulating layer thin film, and then performing processes such as exposing, developing, etching and stripping the photoresist to form a layer structure of the gate insulating layer.

For example, the gate insulating layer 103 includes a first gate insulating layer 103a, a second gate insulating layer 103b, a third gate insulating layer 103c, and a fourth gate insulating layer 103d which are stacked, that is, the gate insulating layer 103 is a four-layer laminated structure; a layer structure of the gate insulating layer 103 that is in contact with the oxide semiconductor layer 105 is a fourth gate insulating layer 103d; a material of the fourth gate insulating layer 103d is at least one of insulating oxide such as silicon oxide ($SiO_2$), aluminum oxide ($Al_2O_3$), titanium oxide ($TiO_2$), hafnium oxide ($HfO_2$), tantalum oxide ($Ta_2O_5$) and zirconium oxide ($ZrO_2$). The materials of the first gate insulating layer 103a, the second gate insulating layer 103b and the third gate insulating layer 103c are all insulating nitride, for example, at least one of silicon nitride ($SiN_x$), aluminum nitride ($AlN_x$), etc.

For example, a plasma-enhanced chemical vapor deposition (PECVD) method may also be adopted to deposit silicon oxide ($SiO_2$) or silicon nitride ($SiN_x$), etc., to form a gate insulating layer thin film.

For example, a thickness of the second gate insulating layer 103b is greater than a thickness of the first gate insulating layer 103a and is greater than a thickness of the third gate insulating layer 103c; and thicknesses of the first gate insulating layer 103a and the third gate insulating layer 103c may be respectively 50 Å to 100 Å; a density of the first gate insulating layer 103a and a density of the third gate insulating layer 103c are both greater than a density of the second gate insulating layer 103b; the hydrogen content in the first gate insulating layer 103a and the hydrogen content in the third gate insulating layer 103c are low; and the content of silane and ammonia in the reaction raw materials is low, so that the first gate insulating layer 103a and the third gate insulating layer 103c can not be formed on a large scale. The thickness of the second gate insulating layer 103b is 2,000 Å to 4,000 Å; the second gate insulating layer 103b may be deposited at a high speed and may be produced on a large scale; and the formed second gate insulating layer 103b has a high hydrogen content.

Figure 12D:
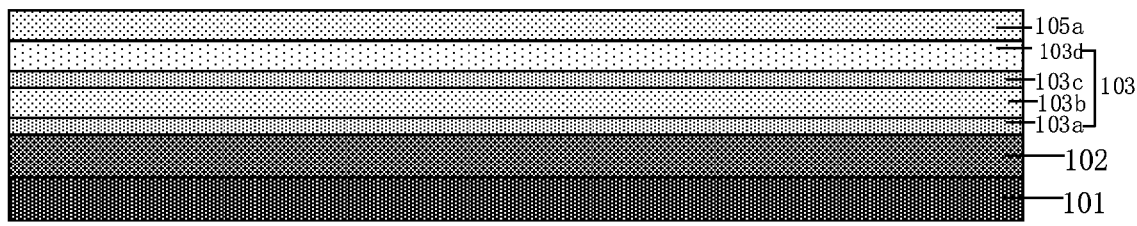

As shown in FIG. 12D, a first oxide semiconductor layer thin film is applied on the gate insulating layer 103 and a patterning process is performed to form the first oxide semiconductor layer 105a.

For example, the first oxide semiconductor layer 105a may be formed by using a method such as magnetron sputtering, reactive sputtering, anodizing, or spin coating. The material and the thickness of the first oxide semiconductor layer 105a may refer to the above-mentioned relevant descriptions, which are omitted herein.

Figure 12E:
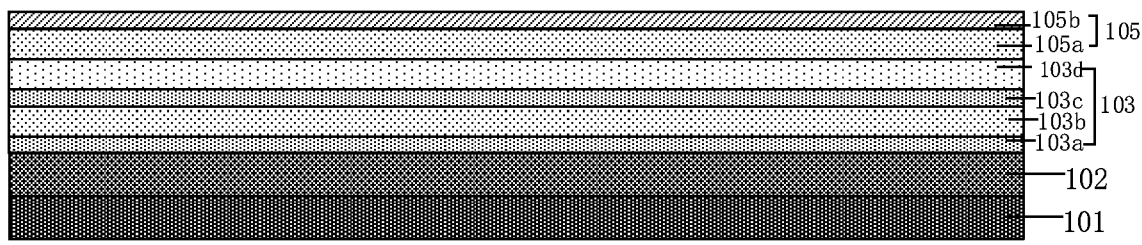

As shown in FIG. 12E, a second oxide semiconductor layer thin film is applied on the first oxide semiconductor layer 105a and a patterning process is performed to form a second oxide semiconductor layer 105b; and a density of the second oxide semiconductor layer 105b is greater than a density of the first oxide semiconductor layer 105a.

For example, the material of the second oxide semiconductor layer 105b and the material of the first oxide semiconductor layer may be the same or different; in a case that the material of the second oxide semiconductor layer 105b is the same as the material of the first oxide semiconductor layer, a molar ratio of the metal element to the oxygen element in the first oxide semiconductor layer is less than a molar ratio of the metal element to the oxygen element in the second oxide semiconductor layer, so that the density of the second oxide semiconductor layer 105b is greater than the density of the first oxide semiconductor layer 105a.

For example, the second oxide semiconductor layer 105b may also be formed by using a method such as magnetron sputtering, reactive sputtering, anodizing, or spin coating.

Figure 12F:
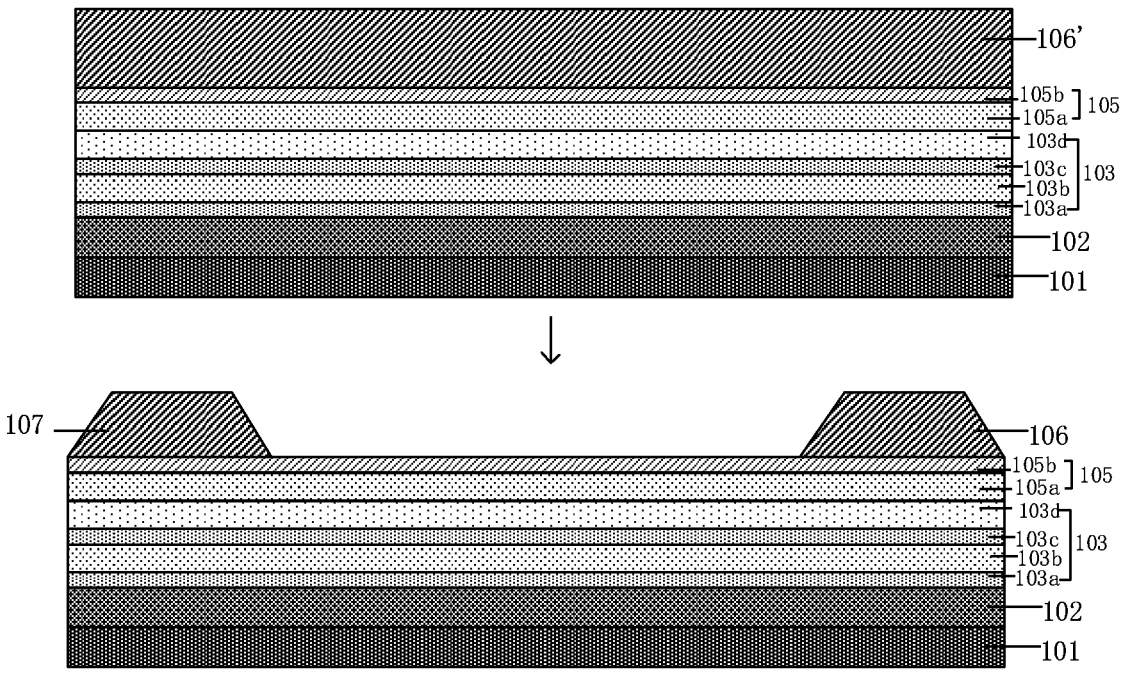

As shown in FIG. 12F, a metal electrode thin film 106' is applied on a side of the second oxide semiconductor layer 105b away from the base substrate 101, and a patterning process is performed on the metal electrode thin film 106' to form a source electrode 106 and a drain electrode 107 spaced apart from each other.

For example, the material and the thickness of the source electrode 106 and the drain electrode 107 may refer to the above-mentioned relevant descriptions, which are omitted herein.

Figure 12G:
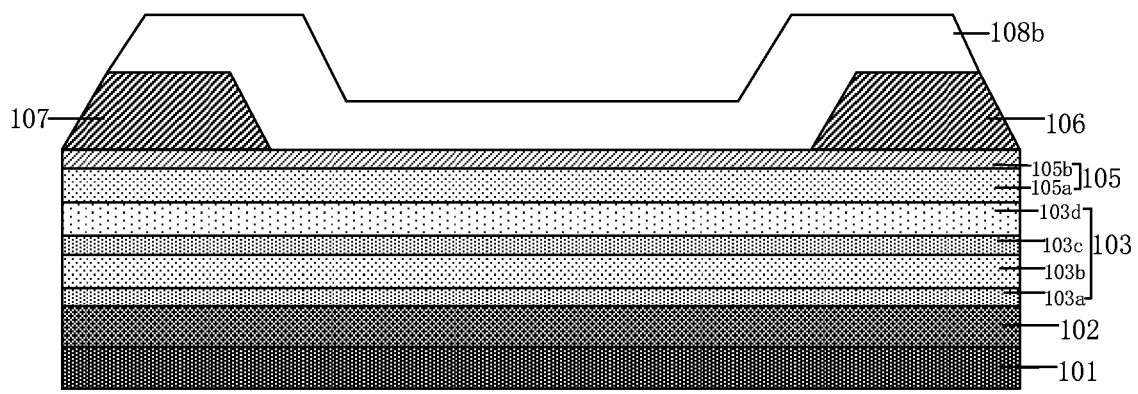

As shown in FIG. 12G, a first oxide insulating thin film is applied on a side of the source electrode 106 and the drain electrode 107 away from the base substrate 101 to form a first insulating layer 108b.

For example, the material, the thickness, and the formation mode and so on of the first insulating layer 108b can refer to the above-mentioned relevant descriptions, which are omitted herein.

Figure 12H:
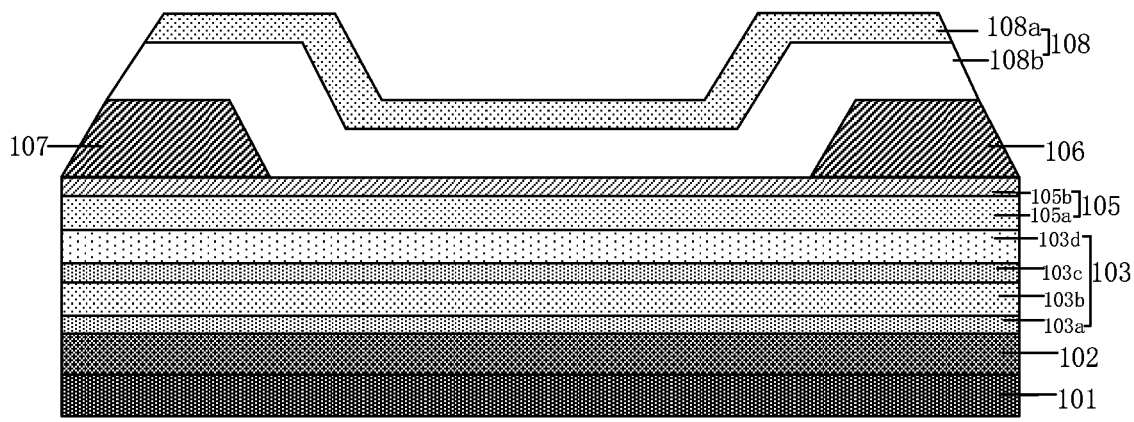

As shown in FIG. 12H, a second oxide insulating thin film is applied on a side of the first insulating layer 108b away from the base substrate 101 to form a second insulating layer 108a; a density of the second insulating layer 108a is greater than a density of the first insulating layer 108b; and the first insulating layer 108b is in contact with the second oxide semiconductor layer 105b.

For example, the second oxide semiconductor layer 105b and the first insulating layer 108b are in contact with each other in a region between the source electrode 106 and the drain electrode 107.

For example, the material, the thickness and the formation mode and so on of the second insulating layer 108a can refer to the above-mentioned relevant descriptions, which are omitted herein.

Figure 12I:
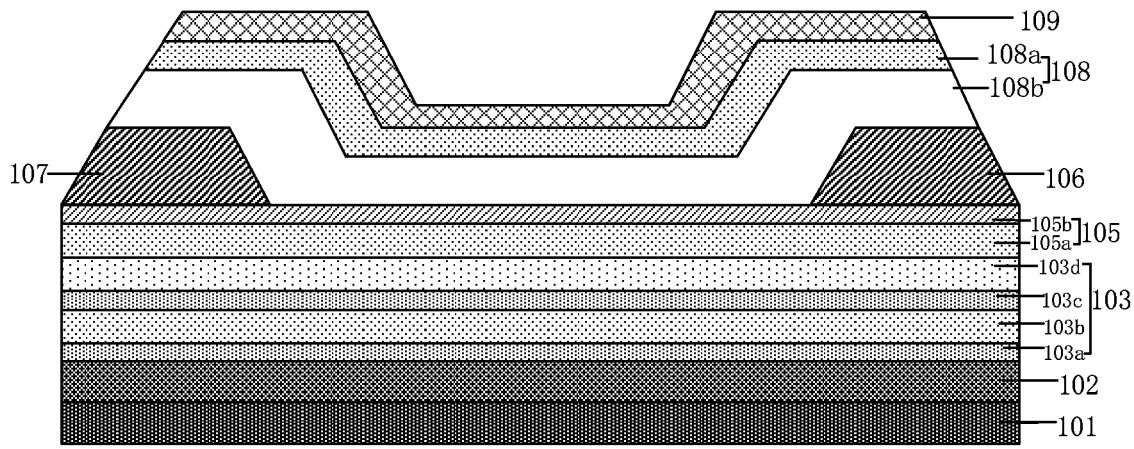

As shown in FIG. 12I, a passivation layer thin film is applied on the second insulating layer 108a, and a passivation layer 109 is formed.

For example, the passivation layer is formed by using plasma chemical vapor deposition; a material of the passivation layer 109 includes silicon nitride (SiNx), silicon oxide (SiOx), acrylic resin, and so on, and the passivation layer 109 may prevent external impurities or water vapor from entering the thin film transistor, thereby affecting performance of the thin film transistor.

For example, a passivation layer thin film may also be deposited on the second insulating layer 108a; a photoresist is coated on the passivation layer thin film; and the passivation layer thin film may be treated by using processes such as exposing, developing, etching, and stripping photoresist to form the passivation layer.

For example, the passivation layer 109 may prevent external impurities or water vapor from entering the thin film transistor 100, thereby avoiding influence on the performance of the thin film transistor.

Figure 13A:
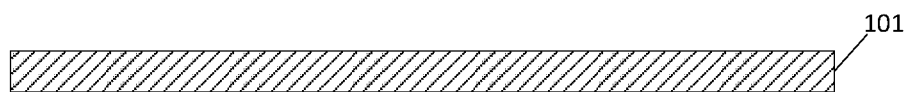
FIG. 13A to FIG. 13I are process charts of still another preparation method of a thin film transistor provided by an embodiment of the present disclosure.

For example, FIG. 13A to FIG. 13I are process charts of still another preparation method of a thin film transistor provided by an embodiment of the present disclosure, as shown in FIG. 13A, the preparation method includes the steps as follows.

As shown in FIG. 13A, a base substrate 101 is provided, the material of the base substrate 101 can refer to the above-mentioned relevant descriptions, which are omitted herein.

Figure 13B:

As shown in FIG. 13B, a buffer layer 104 is formed on the base substrate 101.

For example, a material of the buffer layer 104 includes at least one of silicon nitride (SiNx), silicon oxide (SiOx) and so on.

Figure 13C:
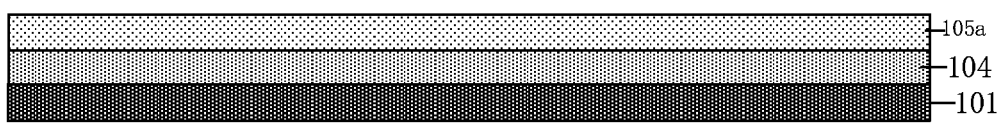

As shown in FIG. 13C, a first oxide semiconductor layer 105 a is formed on the buffer layer 104; the material and the thickness of the first oxide semiconductor layer 105 can refer to the above-mentioned relevant descriptions, which are omitted herein.

Figure 13D:
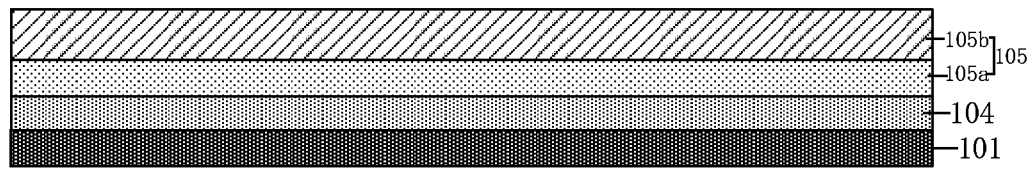

As shown in FIG. 13D, a second oxide semiconductor layer 105b is formed on the first oxide semiconductor layer 105a; the material and the thickness of the second oxide semiconductor layer 105b can refer to the above-mentioned relevant descriptions, which are omitted herein.

Figure 13E:
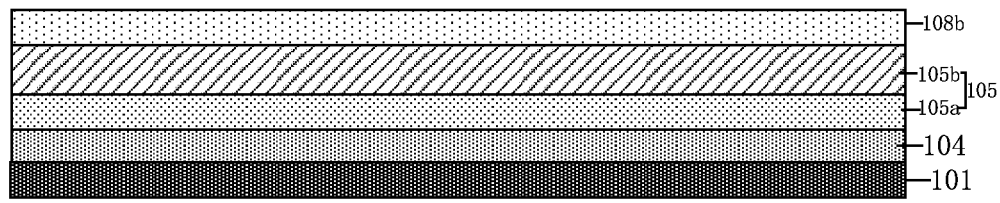

As shown in FIG. 13E, a first insulating layer 108b is formed on the second oxide semiconductor layer 105b, the material, the thickness and the formation mode and so on of the first insulating layer 108b can refer to the above-mentioned relevant descriptions, which are omitted herein.

Figure 13F:
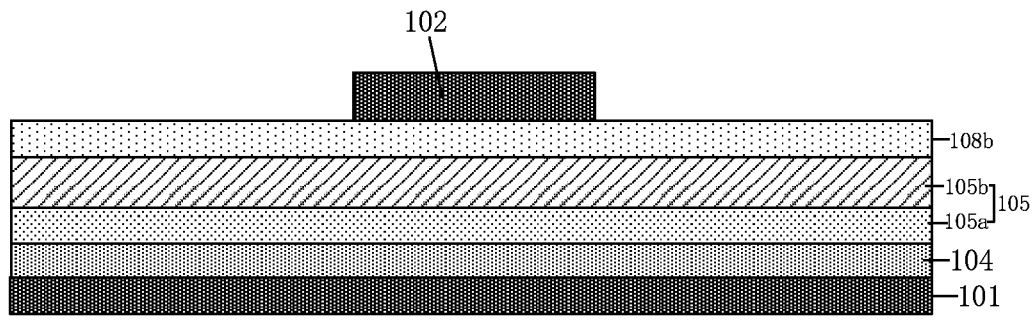

As shown in FIG. 13F, a gate electrode thin film is applied on the first insulating layer 108b, and a patterning process is performed on the gate electrode thin film to form the gate electrode 102.

For example, the material, the thickness and the formation mode of the gate electrode 102 can refer to the above-mentioned relevant descriptions, which are omitted herein.

Figure 13G:
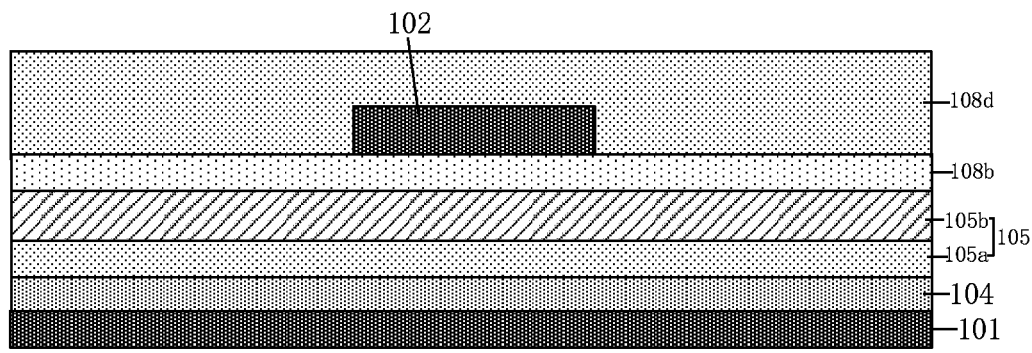

As shown in FIG. 13G, a fourth insulating thin film is applied on the gate electrode 102 to form a fourth insulating layer 108d.

For example, the material and the thickness of the fourth insulating layer 108d can refer to the above-mentioned relevant descriptions, which are omitted herein.

Figure 13H:
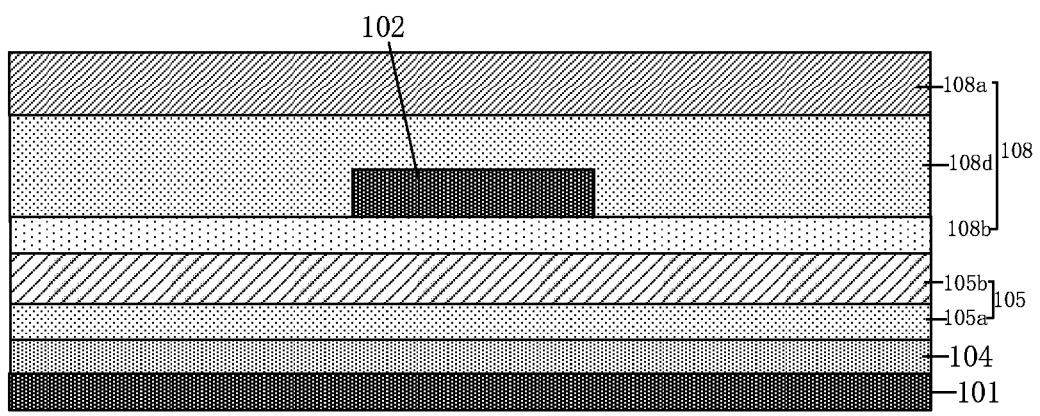

As shown in FIG. 13H, a second insulating layer 108a is formed on the fourth insulating layer 108d; for example, the material and the thickness of the second insulating layer 108a can refer to the above-mentioned relevant descriptions, which are omitted herein.

For example, in other examples, for example, in the example of forming an insulating layer also having the fifth insulating layer 108e as shown in FIG. 5, the material and the thickness of the fifth insulating layer 108e can refer to the above-mentioned relevant descriptions, which are omitted herein.

Figure 13I:
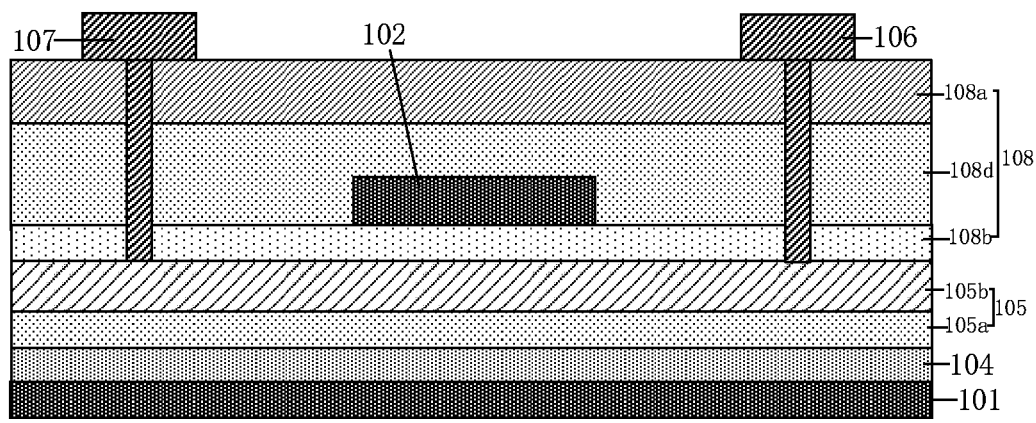

As shown in FIG. 13I, a via hole structure (not shown) passing through the insulating layer 108 is formed in the insulating layer 108 composed of the first insulating layer 108b, the second insulating layer 108a and the fourth insulating layer 108d; then a metal electrode thin film is applied on the second insulating layer 108a, and a patterning process is performed on the metal electrode thin film to form the source electrode 106 and the drain electrode 107 spaced apart from each other.

For example, in other examples, for example, in an example of the insulating layer also formed with the fifth insulating layer 108e, a via hole structure passing through the insulating layer 108 may be formed in the insulating layer 108 composed of the first insulating layer 108b, the second insulating layer 108a, the fourth insulating layer 108d, and the fifth insulating layer 108e.

For example, in other examples, for example, in an example of forming an insulating layer having the sixth insulating layer 108f as shown in FIG. 6, a via hole structure passing through the insulating layer 108 may be formed in the insulating layer 108 composed of the first insulating layer 108b, the second insulating layer 108a and the sixth insulating layer 108f; the material and the thickness of the sixth insulating layer 108f can refer to the above-mentioned relevant descriptions, which are omitted herein.

For example, the oxide thin film transistor, the display device, and the preparation method of the oxide thin film transistor provided by the embodiments of the present disclosure have at least one of beneficial effects as follows.

(1) In the oxide thin film transistor provided by the embodiments of the present disclosure, structure, material, thickness, number of layers, and density of the insulating layer are adjusted, so that the insulating layer adjacent to or in contact with the oxide semiconductor layer has sufficient oxygen replenishment capability for the oxide semiconductor layer, to prevent the oxide semiconductor layer from being conductorized.

(2) In the oxide thin film transistor provided by the embodiment of the present disclosure, the density of the multi-layer insulating oxide is adjusted, so that the oxygen in the oxide semiconductor layer is firmly fixed in the oxide semiconductor layer, to reduce loss of the oxygen element in a subsequent high temperature annealing process, so as to ensure stability of the characteristics of the oxide thin film transistor, and also leave more room for adjusting development of a subsequent process, making choices of subsequent processes more flexible.

The following points required to be explained:

(1) the drawings of the embodiments of the present disclosure only relate to the structures related to the embodiments of the present disclosure, and other structures can refer to the general design.

For clarity, in the drawings used to describe the embodiments of the present disclosure, the thickness of the layer or region is enlarged or reduced, that is, these drawings are not drawn to an actual scale. It is understood that when an element such as a layer, a film, a region or a substrate is referred to as being "above" or "below" another element, the element may be "directly" "above" or "below" another element, or there may be an intermediate element.

(3) without conflict, the embodiments of the present disclosure and the features in the embodiments may be combined with each other to obtain new embodiments.

What are described above is only the specific embodiments of the present disclosure, but the protection scope of the present disclosure is not limited to this, and the protection scope of the present application shall be defined by the accompanying claims.

What is claimed is:

1. An oxide thin film transistor, comprising:
a base substrate;
an oxide semiconductor layer provided on the base substrate, and
an insulating layer provided on a side of the oxide semiconductor layer away from the base substrate;
wherein the insulating layer is made of oxide; the insulating layer comprises a first insulating layer and a second insulating layer which are stacked; a density of the second insulating layer is greater than a density of the first insulating layer; and the second insulating layer is farther away from the base substrate than the first insulating layer;

the insulating layer further comprises a third insulating layer, the third insulating layer is provided on a side of the first insulating layer close to the base substrate;

the oxide semiconductor layer and the insulating layer are in contact with each other in a region between a source electrode and a drain electrode;

a gate electrode is provided between a layer where the source electrode and the drain electrode are located and the oxide semiconductor layer; the insulating layer further comprises a fourth insulating layer provided between the first insulating layer and the second insulating layer; and the gate electrode is provided between the fourth insulating layer and the first insulating layer.

2. The oxide thin film transistor according to claim 1, wherein the oxide semiconductor layer is a metal oxide semiconductor layer, and the insulating layer is made of non-metallic oxide.

3. The oxide thin film transistor according to claim 1, wherein materials of the first insulating layer and the second insulating layer at least comprise O atom and Si atom.

4. The oxide thin film transistor according to claim 1, wherein a density of the third insulating layer is greater than the density of the first insulating layer; and the third insulating layer is in contact with the oxide semiconductor layer.

5. The oxide thin film transistor according to claim 4, wherein a difference between an etching rate of the first insulating layer and an etching rate of the second insulating layer is 20 Å/s to 40 Å/s; and a difference between the etching rate of the first insulating layer and an etching rate of the third insulating layer is 10 Å/s to 20 Å/s.

6. The oxide thin film transistor according to claim 4, wherein an etching solution used for etching the first insulating layer, the second insulating layer and the third insulating layer is a mixed solution of $NH_3F$ and HF; in the mixed solution of $NH_3F$ and HF, mass percentages of $NH_3F$ and HF are respectively 29.8% to 30.2% and 5.9% to 6.1%.

7. The oxide thin film transistor according to claim 4, wherein under a temperature condition of 200° C. to 350° C., an oxygen release amount of the second insulating layer, the first insulating layer and the third insulating layer which are stacked is less than a sum of oxygen release amounts of the second insulating layer, the first insulating layer and the third insulating layer as single layers within a same temperature range.

8. The oxide thin film transistor according to claim 1, wherein the oxide semiconductor layer comprises a first oxide semiconductor layer and a second oxide semiconductor layer which are stacked; a density of the second oxide semiconductor layer is greater than a density of the first oxide semiconductor layer; and the second oxide semiconductor layer is farther away from the base substrate than the first oxide semiconductor layer.

9. The oxide thin film transistor according to claim 1, wherein the insulating layer further comprises a fifth insulating layer provided between the first insulating layer and the fourth insulating layer; a density of the fifth insulating layer is greater than a density of the first insulating layer; and both a material of the fifth insulating layer and a material of the first insulating layer comprise Si and O.

10. The oxide thin film transistor according to claim 1, wherein a difference between an etching rate of the first insulating layer and an etching rate of the second insulating layer is 20 Å/s to 40 Å/s.

11. A display device, comprising the oxide thin film transistor according to claim 1.

12. A preparation method of an oxide thin film transistor, comprising:
providing a base substrate;
forming an oxide semiconductor layer on the base substrate;
forming a first insulating layer on a side of the oxide semiconductor layer away from the base substrate; and
forming a second insulating layer on a side of the first insulating layer away from the base substrate;
forming a third insulating layer on a side of the first insulating layer close to the base substrate;
forming a fourth insulating layer between the first insulating layer and the second insulating layer;
wherein a density of the second insulating layer is greater than a density of the first insulating layer; the oxide semiconductor layer and the third insulating layer are in contact with each other in a region between a source electrode and a drain electrode, a gate electrode is formed between a layer where the source electrode and the drain electrode are located and the oxide semiconductor layer, and the gate electrode is provided between the fourth insulating layer and the first insulating layer.

13. The preparation method according to claim 12, a density of the third insulating layer is greater than the density of the first insulating layer.

14. The preparation method according to claim 12, wherein the forming an oxide semiconductor layer comprises:
applying a first oxide semiconductor layer thin film and performing a patterning process to form the first oxide semiconductor layer;
applying a second oxide semiconductor layer thin film on the first oxide semiconductor layer and performing a patterning process to form a second oxide semiconductor layer;
wherein a density of the second oxide semiconductor layer is greater than a density of the first oxide semiconductor layer.

* * * * *